(12) United States Patent
Tamura

(10) Patent No.: US 8,551,849 B2
(45) Date of Patent: Oct. 8, 2013

(54) SEMICONDUCTOR DEVICE AND METHOD OF MANUFACTURING THE SAME

(75) Inventor: Naoyoshi Tamura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/366,572

(22) Filed: Feb. 6, 2012

(65) Prior Publication Data

US 2012/0135574 A1 May 31, 2012

Related U.S. Application Data

(62) Division of application No. 12/183,676, filed on Jul. 31, 2008, now Pat. No. 8,134,189.

(30) Foreign Application Priority Data

Oct. 9, 2007 (JP) ................................. 2007-263719

(51) Int. Cl.
*H01L 21/331* (2006.01)
(52) U.S. Cl.
USPC ........... 438/366; 438/153; 438/154; 438/199; 438/303; 257/E21.626; 257/E29.152
(58) Field of Classification Search
USPC .......................... 438/303, 366, 153, 154, 199; 257/E21.626, E29.152
See application file for complete search history.

(56) References Cited

U.S. PATENT DOCUMENTS

| | | | |
|---|---|---|---|
| 7,545,023 B2 | 6/2009 | Chien | |
| 7,611,938 B2 * | 11/2009 | Cheng et al. | 438/199 |
| 7,723,808 B2 | 5/2010 | Okuda et al. | |
| 7,736,957 B2 * | 6/2010 | Grudowski et al. | 438/153 |
| 2002/0037612 A1 | 3/2002 | Segawa | |
| 2003/0203556 A1 | 10/2003 | Segawa | |
| 2005/0093075 A1 | 5/2005 | Bentum et al. | |
| 2005/0199945 A1 | 9/2005 | Kodama et al. | |
| 2006/0186557 A1 | 8/2006 | Shima et al. | |
| 2007/0128786 A1 * | 6/2007 | Cheng et al. | 438/199 |

(Continued)

FOREIGN PATENT DOCUMENTS

| | | |
|---|---|---|
| JP | 2005-294791 | 10/2005 |
| JP | 2006-237263 | 9/2006 |

(Continued)

OTHER PUBLICATIONS

USPTO, (TRAN) Notice of Allowance and Notice of Allowability, Nov. 14, 2011, in parent U.S. Appl. No. 12/183,676 [Allowed].

(Continued)

*Primary Examiner* — Long K Tran
(74) *Attorney, Agent, or Firm* — Fujitsu Patent Center

(57) ABSTRACT

Aimed at providing a highly reliable semiconductor device appropriately increased in stress at the channel region so as to improve carrier injection rate, thereby dramatically improved in transistor characteristics, and made adaptable also to recent narrower channel width, and a method of manufacturing the same, and a method of manufacturing the same, a first sidewall composed of a stress film having expandability is formed on the side faces of a gate electrode, a second sidewall composed of a film having smaller stress is formed on the first sidewall, and a semiconductor, which is a SiC layer for example, is formed as being positioned apart from the first sidewall while placing the second sidewall in between.

7 Claims, 22 Drawing Sheets

(56) References Cited

U.S. PATENT DOCUMENTS

| | | | |
|---|---|---|---|
| 2007/0181950 A1 | 8/2007 | Miyake et al. | |
| 2008/0054347 A1 | 3/2008 | Wang | |
| 2009/0085123 A1 | 4/2009 | Sato | |
| 2012/0193679 A1* | 8/2012 | Chen et al. | 257/192 |

FOREIGN PATENT DOCUMENTS

| | | |
|---|---|---|
| JP | 2006-253313 | 9/2006 |
| JP | 2006-261283 | 9/2006 |
| JP | 2007-200972 A | 8/2007 |
| JP | 2008-66548 A | 3/2008 |
| JP | 2009-88069 A | 4/2009 |
| WO | WO-2007-077748 A1 | 7/2007 |

OTHER PUBLICATIONS

USPTO, (TRAN) Final Rejection, Apr. 25, 2011, in parent U.S. Appl. No. 12/183,676 [Allowed].

USPTO, (TRAN) Non-Final Rejection, Nov. 2, 2010, in parent U.S. Appl. No. 12/183,676 [Allowed].

USPTO, (TRAN) Restriction Requirement, Aug. 13, 2010, in parent U.S. Appl. No. 12/183,676 [Allowed].

Japanese Office Action mailed Nov. 20, 2012 for corresponding Japanese Application No. 2007-263719, with Partial English-language Translation.

* cited by examiner

|  | nMOS | pMOS |
| --- | --- | --- |
| DIRECTION OF CHANNEL LENGTH | TENSILE | COMPRESSIVE |
| DIRECTION OF CHANNEL WIDTH | TENSILE | TENSILE |
| PERPENDICULAR DIRECTION | COMPRESSIVE | TENSILE |

SEMICONDUCTOR DEVICE AND METHOD OF MANUFACTURING THE SAME

CROSS-REFERENCE TO RELATED APPLICATIONS

This application is a divisional of application Ser. No. 12/183,676, filed Jul. 31, 2008, which claims priority from the prior Japanese Patent Application No. 2007-263719, filed on Oct. 9, 2007, the entire contents of which are incorporated herein by reference.

BACKGROUND OF THE INVENTION

1. Field of the Invention

The present invention relates to a semiconductor device improved in operation speed by virtue of stress application, and a method of manufacturing the same.

2. Description of the Related Art

In recent LSI, such as those generally called 90-nm-node devices or thereafter, further micronization has been demanded, making transistor performances more difficult to improve. This may be ascribable to that shortening of the gate length increases stand-by, off-state leakage current, and that any attempt of suppressing the off-state leakage current down to a certain level makes current drivability very difficult to improve. For this reason, a new approach of improving transistor performances has been explored.

One of these attempts is known by strained silicon technique. This is a technique of improving current drivability by modifying band structure through application of stress to the channel region, so as to reduce effective mass of carriers to thereby improve carrier mobility.

For n-channel MOS transistors, it has been known that the carrier mobility may be improved by applying uni-axial tensile stress in the direction of channel length of the channel region. As specific examples of applying tensile stress to the channel region, there are proposed a transistor having a film for applying tensile stress formed on the source/drain region of a silicon substrate, and a transistor having a SiC layer filled up in the source/drain region of a silicon substrate, for the purpose of further reliably applying the tensile stress.

An exemplary configuration of the SiC layer filled up in the source/drain region of an n-channel MOS transistor is shown in FIG. 21. In this case, a SiC layer 104 is formed as being buried in a source/drain region 103, on both sides of a gate electrode 101 having sidewalls 102 on both side faces thereof.

Directional sensitivity of stress applied to the channel region of an n-channel MOS transistor and a p-channel MOS transistor, aiming at improving transistor characteristics, is shown in FIG. 22B. Now as listed in FIG. 22A, strain in the direction of channel length of the channel region is given as $\epsilon_{xx}$, strain in the direction perpendicular to the channel region is given as $\epsilon_{yy}$, and strain in the direction of the channel width is given as $\epsilon_{zz}$.

The directional sensitivity of stress aimed at improving transistor characteristics of n-channel MOS transistor may preferably lie in the direction of stretching for $\epsilon_{xx}$, in the direction of compression for $\epsilon_{yy}$, and in the direction of stretching for $\epsilon_{zz}$. However, as shown in FIG. 21, SiC is smaller than Si in the lattice constant, so that any attempt of matching the in-plane lattice thereof to Si as a mother crystal may result in application of planar stress (indicated by arrow A) to the adjacent Si, due to shrinking tendency of the SiC layer 104 per se. As a consequence, in an actual transistor structure, it is understood that the channel region is always applied with compressive stress in the direction of channel width (indicated by arrow B).

In addition, in a transistor structure having a narrow channel region, an element isolation structure, for example, STI element isolation structure, will exert larger influences, and will further increase the compressive stress ascribable to the SiC layer 104 in the direction of channel width of the channel region. FIG. 23 is a characteristic drawing showing strain in the direction of channel width, assuming an origin at the center portion of the channel region. It is understood that the compressive strain in the direction of channel width sharply increases as the position comes closer to the element isolation structure. For this reason, the transistor characteristics of the n-channel MOS transistor with narrow channel width may further be degraded.

In addition, the n-channel MOS transistor shown in FIG. 21 is not understood as being sufficient in terms of compressive strain in the direction perpendicular to the channel region, and is still in need of an effort of further increasing the compressive strain.

For further improvement in the transistor characteristics, it may be also necessary to improve stress of the semiconductor layer, for example the SiC layer, to be filled up in the source/drain region. However, the SiC layer in particular has a stable amount of introduction of C of only as very small as 2% to 3%, and is poor in thermal stability, so that it is difficult to improve the transistor characteristics by further increasing the amount of introduction of C.

In contrast, aiming at improving transistor characteristics of p-channel MOS transistor, Patent Document 3 discloses a configuration in which a SiGe layer is formed as being filled up in the source/drain region, and a tensile stress film is formed on the substrate so as to cover the gate electrode and the sidewall. However, strain action of the SiGe layer and the element isolation structure in the direction of channel width exerted to the channel region of the p-channel MOS transistor is different from that in the n-channel MOS transistor. It is therefore difficult to solve the above-described problems of n-channel MOS transistor by the configuration described in Patent Document 3, even if the constituents in Patent Document 3 should appropriately be replaced by those for n-channel MOS transistor.

The present invention was conceived after considering the above-described problems, and an object thereof is to provide a highly reliable semiconductor device appropriately increased in stress at the channel region so as to improve carrier injection rate and carrier mobility, thereby dramatically improved in transistor characteristics, and made adaptable also to recent narrower channel width, and a method of manufacturing the same.

SUMMARY OF THE INVENTION

According to the present invention, there is provided a semiconductor device which includes a semiconductor substrate, a gate insulating film formed over the semiconductor substrate, a gate electrode formed over the gate insulating film; a first sidewall including a stress film, formed over the side faces of the gate electrode, and a semiconductor layer formed in the surficial portion of the semiconductor substrate, wherein the semiconductor layer is positioned apart from the first sidewall.

DETAILED DESCRIPTION OF THE PREFERRED EMBODIMENTS

First, strain action in the direction of channel width of the channel region of an n-channel MOS transistor according to the present invention will be explained.

Figure 21:
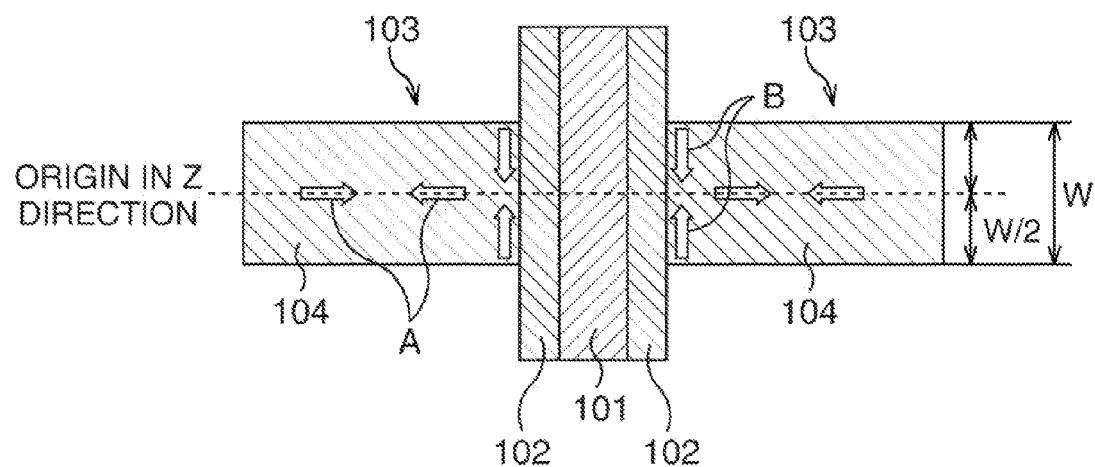
FIG. 21 is a plan view showing an exemplary configuration of an n-channel MOS transistor, having a SiC layer formed as being filled up in the source/drain region.
Figures 22A, 22B:
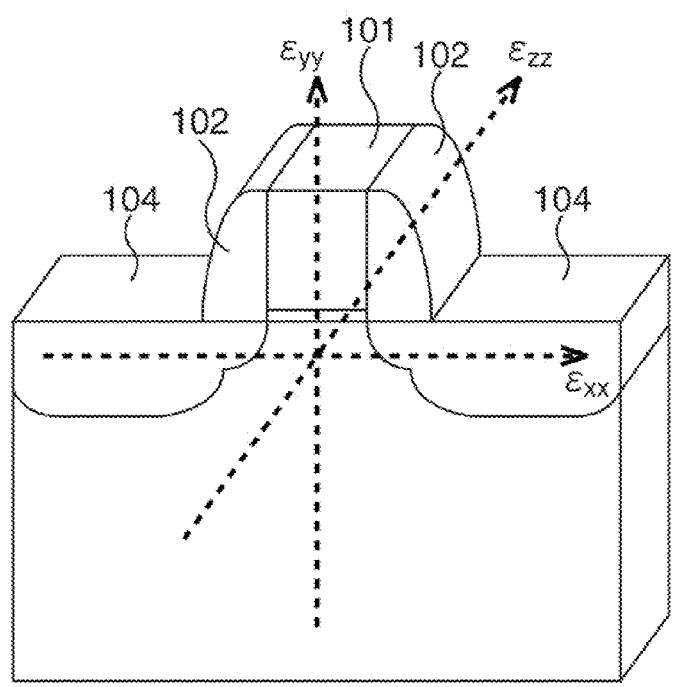
FIGS. 22A and 22B are drawings explaining directional sensitivity of stress applied to the channel region of an n-channel MOS transistor and a p-channel MOS transistor in order to improve the individual transistor characteristics.

As shown in FIG. 21, the channel region is always applied with compressive stress (indicated by arrow B) in the direction of channel width, by the SiC layer 104 formed as being filled up in the source/drain region 103.

Figure 1A:
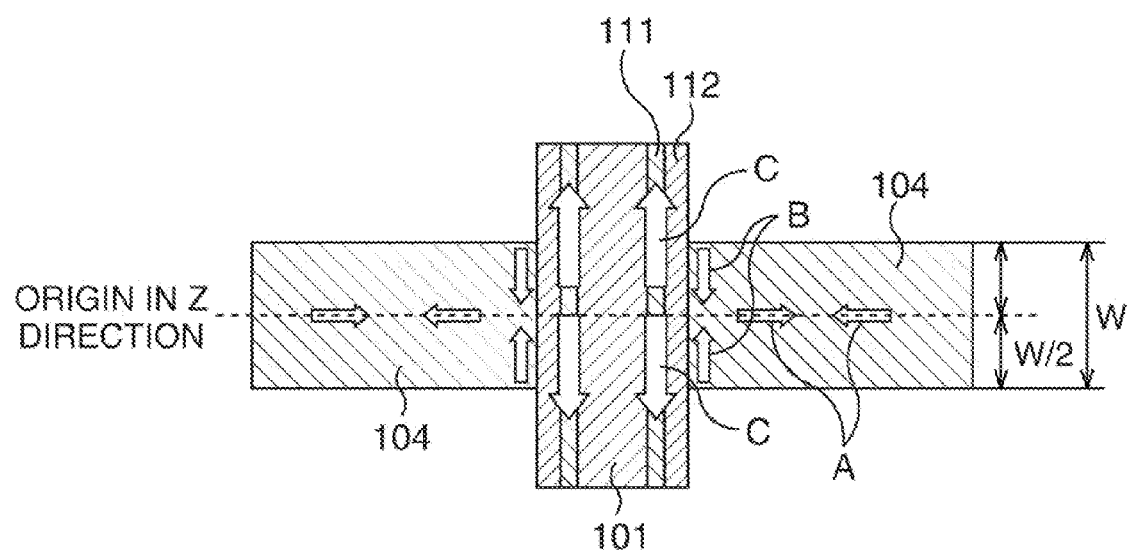
FIGS. 1A and 1B are schematic drawings showing strain action in an n-channel MOS transistor according to the present invention.
Figure 1B:
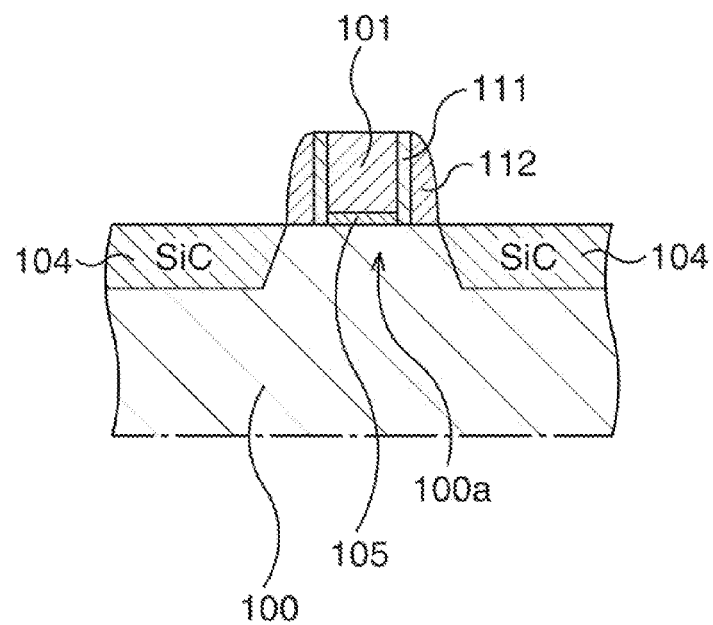

FIGS. 1A and 1B are schematic drawings showing strain action of n-channel MOS transistor according to the present invention, wherein FIG. 1A is a plan view, and FIG. 1B is a sectional view. In FIGS. 1A and 1B, any constituents commonly appear in FIG. 21 will be given with the same reference numerals for the convenience's sake.

Typically in the present invention, a semiconductor layer, which is the SiC layer 104 for example, is formed in the source/drain region in the silicon substrate 100, and on the silicon substrate 100, a first sidewall 111 composed of a stress film having expandability, and further thereon a second sidewall 112 composed of a film having stress smaller than that of the first sidewall 111, are formed on the side faces of the gate electrode 101 formed while placing a gate insulating film 105 thereunder, wherein the SiC layer 104 is positioned apart from the first sidewall 111 as being isolated by the second sidewall 112.

In the direction of channel width, as shown in FIG. 1, against compressive stress (indicated by arrow B) applied in the direction of channel width of the channel region 100a, the first sidewall 111 expands the underlying portion (a portion of channel region), so as to apply tensile stress (expressed by arrow C) to the underlying portion. By the tensile stress, the compressive stress may be canceled. By forming the first sidewall 111 as having a large intrinsic stress, such as being adjusted to 2.5 GPa to 4.0 GPa or around on the basis of absolute value, the tensile stress given by the first sidewall 111 may exceed the compressive stress given by the SiC layer 104 in the direction of channel width of the channel region 100a, so that the channel region 100a is consequently applied with tensile strain in the direction of channel width thereof. As a consequence, transistor characteristics of the n-channel MOS transistor may dramatically be improved.

Figure 2:
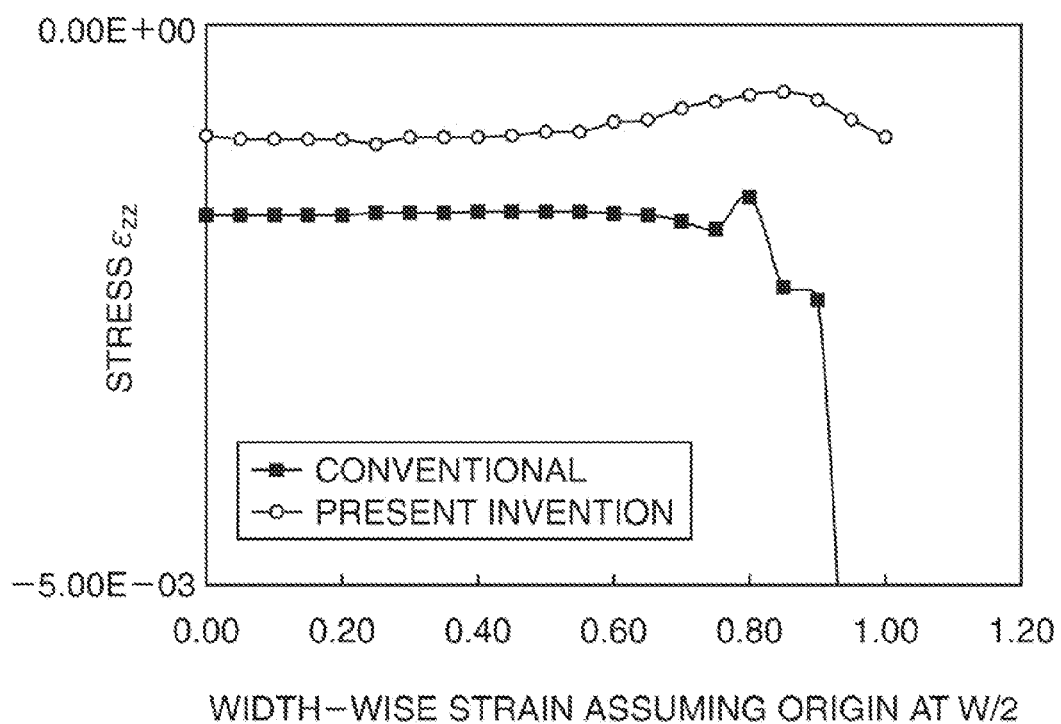
FIG. 2 is a characteristic drawing showing, in comparison with FIG. 23, strain in the direction of channel width of the n-channel MOS transistor according to the present invention, while assuming the origin at the center portion of channel region.
Figure 23:
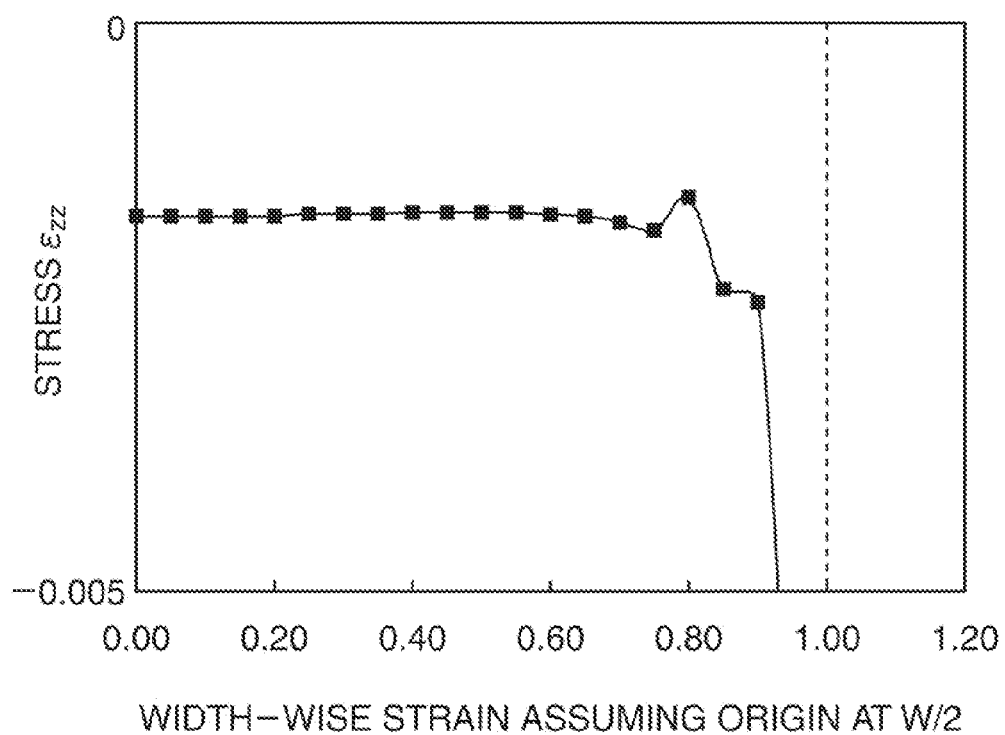
FIG. 23 is a characteristic drawing showing strain in the direction of channel width assuming the origin at the center portion of the channel region.

FIG. 2 is a characteristic drawing showing strain in the direction of channel width of the n-channel MOS transistor according to the present invention, assuming the origin at the center portion of the channel region, in comparison with FIG. 23.

As is clear from the drawing, the present invention shows overall reduction in the compressive stress, and shows no increase in strain even in the portion close to the element isolation structure. This means that the transistor characteristics of the n-channel MOS transistor dramatically improve.

Next, strain action in the direction of channel length of the channel region and in the direction perpendicular thereto will be explained.

In the direction of the channel length of the channel region 100a, a resultant force of force ascribable to the first sidewall 111 having expandability so as to expand the underlying portion (a portion of the channel region 100a), and force ascribable to the SiC layer 104 so as to expand the adjacent surface in a two-dimensional manner, is exerted in the direction of channel length of the channel region 100a. The resultant force is applied as tensile stress in the direction of the channel length of the channel region 100a, thereby the strain in the tensile direction may increase in an effective manner.

Figure 3:
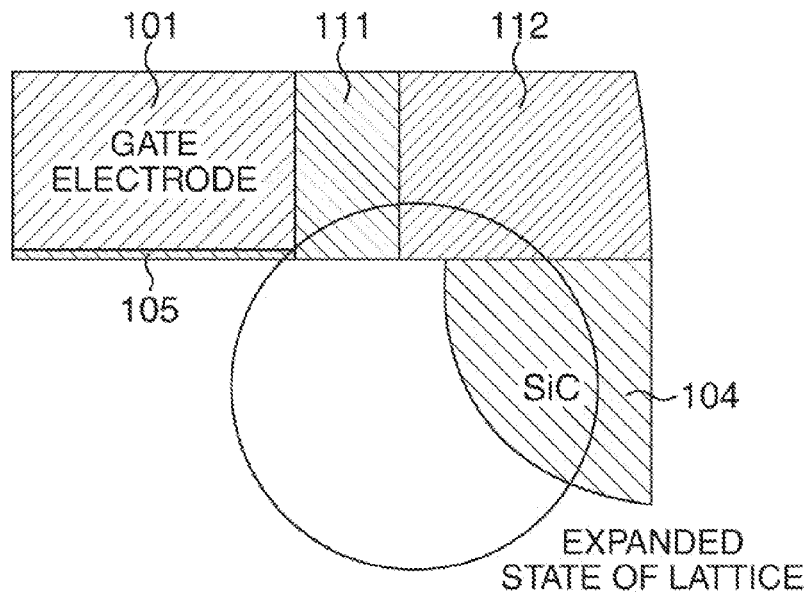
FIG. 3 is a sectional view showing a strain action of n-channel MOS transistor according to the present invention.
Figure 4:
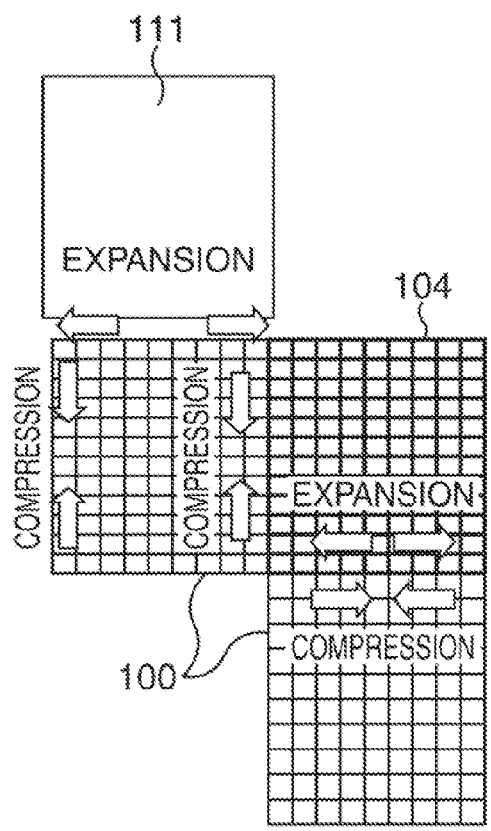
FIG. 4 is a schematic drawing explaining stress, as being corresponded to FIG. 3.

FIG. 3 is a sectional view showing strain action in the n-channel MOS transistor according to the present invention. FIG. 4 is a schematic drawing explaining the stress corresponded to FIG. 3.

In FIG. 3 and FIG. 4, any constituents commonly appear in FIG. 21 will be given with the same reference numerals for the convenience's sake.

In the direction perpendicular to the channel region, the underlying portion of the first sidewall 111 (a portion of Si composing the substrate) acts as expanding the Si lattice under normal temperature, because the first sidewall 111 has a coefficient of thermal expansion smaller than that of the substrate. In this case, the underlying portion is effectively applied with compressive stress in the perpendicular (depthwise) direction.

The SiC layer 104 epitaxially grows while keeping lattice matching with Si composing the substrate. Lattice constant originally owned by SiC is smaller than that of Si, so that the lattice of SiC shrinks in the perpendicular direction (depthwise direction), so as to compress the lattice of Si(110) in the portion brought into contact with the SiC layer 104 side-by-side. More specifically, stress possibly exerted to the channel region 100a in the direction perpendicular thereto is given by a resultant force of compressive stress ascribable to the first sidewall 111 and compressive stress ascribable to the SiC layer 104, effectively increasing strain in the compressive direction. In consideration of operation mechanism of transistors, transistor characteristics may be improved if the channel carriers are in the state of quasi-ballistic transportation in the region having short gate length, so as to improve carrier injection rate (in relation to potential difference and effective mass, wherein the effective mass has a strong positive correlation with strain) at the end portion of source region. In this case, the action right under the first sidewall 111 is strong, so that the effect of carrier injection may become larger at the end portion of the source region.

Figure 5:
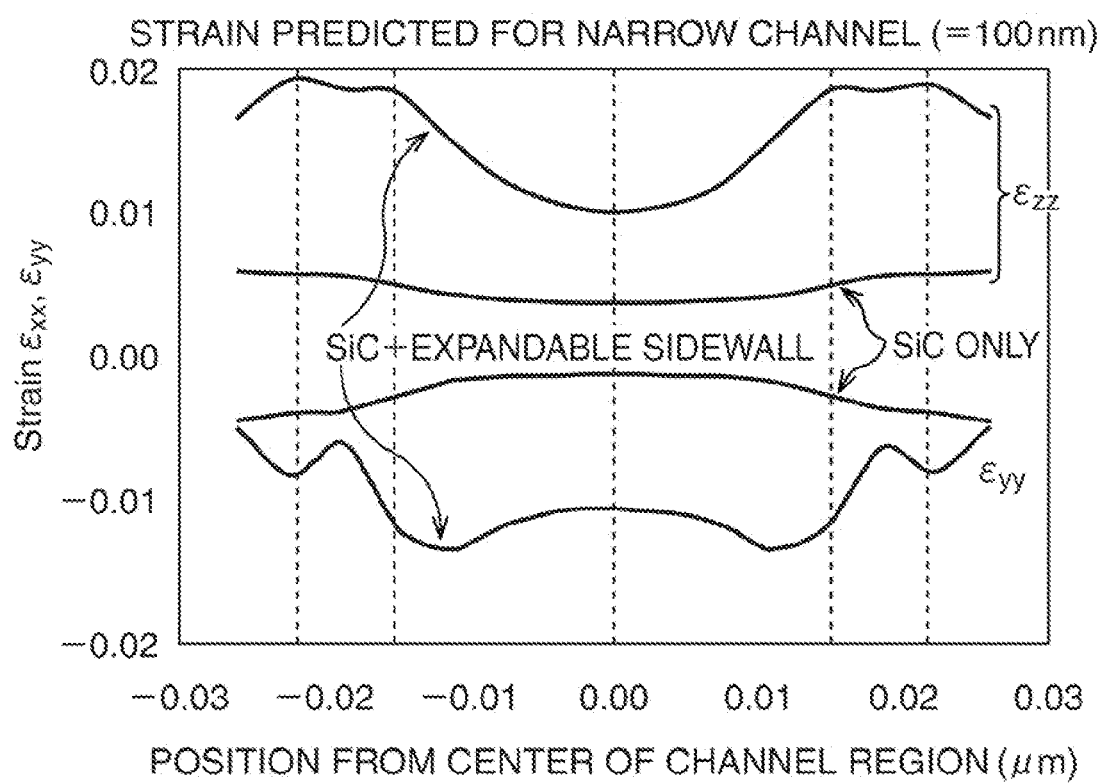
FIG. 5 is a characteristic drawing showing, in comparison with the conventional configuration shown in FIG. 21, strain in the direction of channel length and in the perpendicular direction in the n-channel MOS transistor according to the present invention, while assuming the origin at the center portion of channel region.

FIG. 5 is a characteristics drawing showing, in comparison with the conventional configuration shown in FIG. 21, strain in the direction of channel length and in the perpendicular direction in the n-channel MOS transistor according to the present invention, while assuming the origin at the center portion of channel region.

As shown in the drawing, it is clearly known that tensile stress and compressive stress largely increase in the direction of channel length and in the perpendicular direction, respectively. This means that the transistor characteristics of the n-channel MOS transistor largely improve.

As described in the above, in the n-channel MOS transistor according to the present invention, tensile stress is applied in the direction of channel length of the channel region 100a, tensile stress is applied in the direction of channel width, and compressive stress is applied in the perpendicular direction (depth-wise direction), respectively to sufficient degrees. In the present invention, the SiC layer 104 is positioned apart from the first sidewall 111 as being isolated by the second sidewall 112. Assuming now that the first sidewall 111 having a relatively large stress should be formed as being brought into contact with the SiC layer 104, without forming the second sidewall 112, the SiC layer 104 may produce lattice defect, particularly because SiC is harder than Si (conversely, SiGe is softer than Si). In the present invention, the first sidewall 111 is provided apart from the SiC layer 104 as being isolated by the second sidewall 112, composed of a film smaller in stress than the first sidewall 111, in between, so that stress of the first sidewall 111 is exerted not to the SiC layer 104, but directly to Si composing the silicon substrate 100 right under the first sidewall 111. In this case, the second sidewall 112 smaller in stress than the SiC layer 104 may act as a kind of cushion component, and thereby the SiC layer 104 is prevented from producing crystal defect.

As has been described in the above, by forming the SiC layer 104 as being filled up in the source/drain region, by providing the first sidewall having expandability at the side faces of the gate electrode 101, and by positioning the SiC layer as being apart from the first sidewall, strain at the channel region 100a may appropriately be increased without causing damage to the SiC layer, and thereby carrier injection rate may be improved. By virtue of this configuration, transistor characteristics may dramatically be improved while being adapted also to recent narrower channel width.

The first sidewall herein is preferably formed after the SiC layer is formed, in view of preventing lowering in stress ascribable to annealing, and of keeping the compressive stress even after the transistor was fabricated.

Referring now to Patent Document 4, there is disclosed a technique of forming sidewalls having tensile stress to the gate electrode, so as to moderate compressive stress of the channel region in the direction of channel width. However, in this case, the source/drain region has no semiconductor layer such as SiC layer formed therein, so that of course no consideration is paid on positional relation between the semiconductor layer and the sidewall, which is one of the essential matters for specifying the invention.

Specific embodiments applied with the present invention will be detailed below, referring to the attached drawings. The embodiments below will deal with exemplary cases where the semiconductor device is a CMOS transistor having an n-channel MOS transistor and a p-channel MOS transistor. The present invention is not limited to these embodiments, and is adoptable also to other semiconductor devices having gate electrodes.

A configuration of a CMOS transistor according to this embodiment will be explained, together with a method of manufacturing the same.

FIG. 6A to FIG. 15 are schematic sectional views sequentially showing steps of a method of manufacturing the CMOS transistor according to a first embodiment.

Figure 6A:
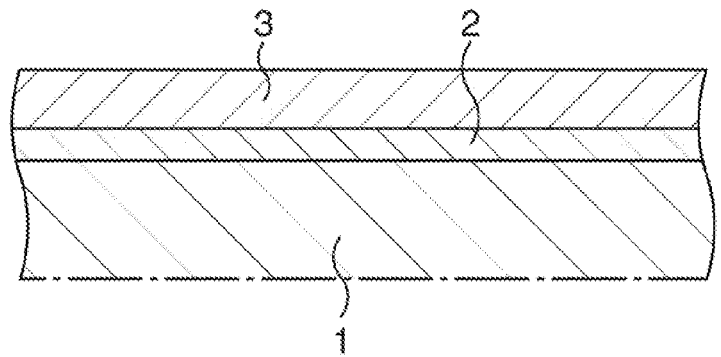
FIGS. 6A to 15 are schematic sectional views sequentially showing steps of manufacturing a CMOS transistor according to a first embodiment.

First, as shown in FIG. 6A, a silicon oxide film 2 and a silicon nitride film 3 are formed in this order on a silicon substrate 1.

More specifically, first, the silicon oxide film 2 of approximately 10 nm thick is formed on the silicon substrate 1, typically by dry oxidation method at 900° C.

Next, the silicon nitride film 3 of approximately 112 nm is formed on the silicon oxide film 2, typically by CVD, typically using $SiH_2Cl_2.NH_3$ as a source gas at 750° C.

Figure 6B:
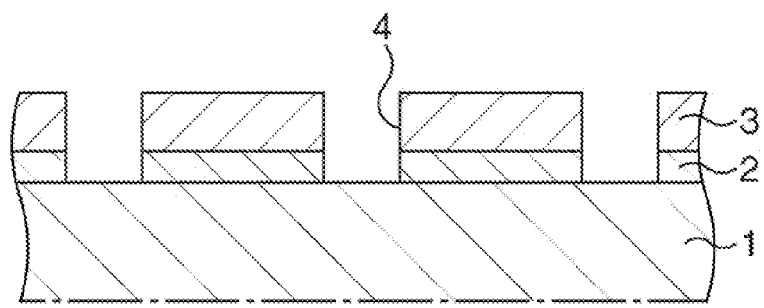

Next, as shown in FIG. 6B, openings 4 are formed in the silicon nitride film 3 and the silicon oxide film 2.

More specifically, portions of the silicon nitride film 3 and the silicon oxide film 2 fallen on the element isolation regions on the silicon substrate 1 are processed by lithography and dry etching, to thereby form openings 4 in the silicon nitride film 3 and the silicon oxide film 2.

Figure 6C:
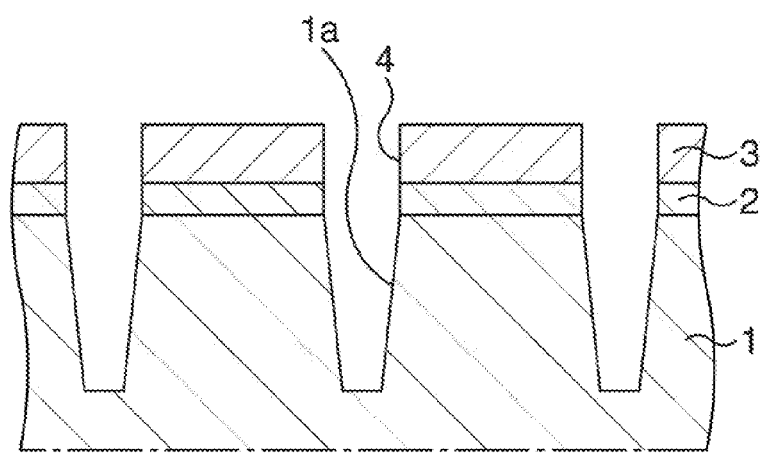

Next, as shown in FIG. 6C, isolation trenches 1a are formed in the silicon substrate 1.

More specifically, the silicon substrate 1 is etched by dry process using the silicon oxide film 2 and the silicon nitride film 3, having the opening 4 formed therein, as a mask, to thereby form isolation trenches 1a at the portions of the silicon substrate 1 exposed out from the openings 4.

Figure 7A:
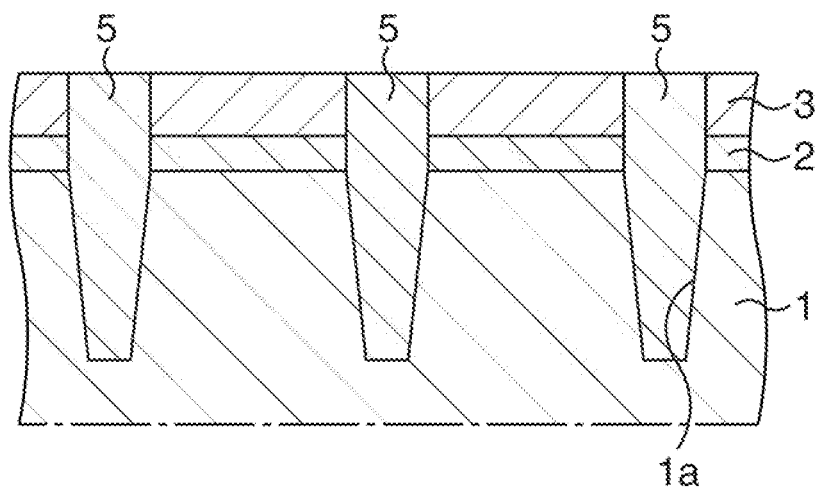

Next, as shown in FIG. 7A, a silicon oxide film 5 is deposited so as to fill up the openings 4 and the isolation trenches 1a.

More specifically, an insulating material, which is the silicon oxide film 5 herein, is deposited typically by plasma CVD process, so as to fill up the openings 4 and the isolation trenches 1a.

Figure 7B:
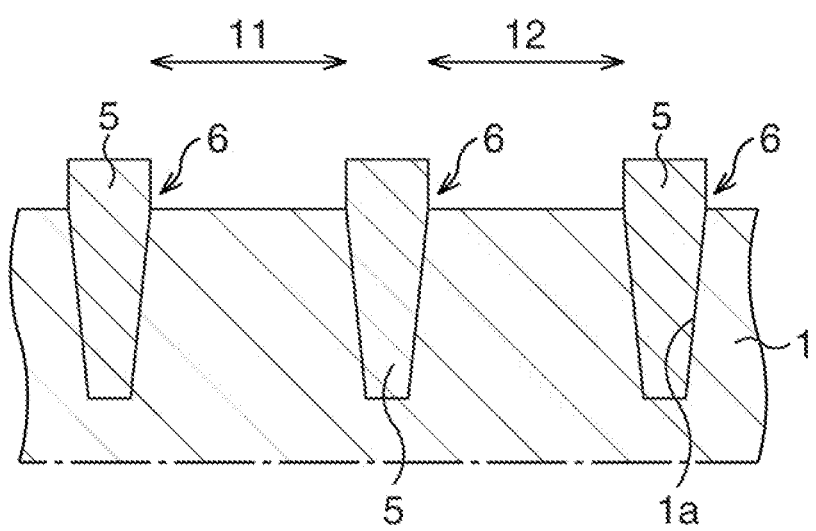

Next, as shown in FIG. 7B, STI element isolation structures 6 are formed.

More specifically, the silicon oxide film 5 is polished and planarized by chemical mechanical polishing (CMP) until the surface of the silicon nitride film 3 exposes. Thereafter, the silicon nitride film 3 is removed by wet etching, and the silicon oxide film 2 exposed thereby is then removed by wet etching using hydrofluoric acid.

By these processes, STI (shallow trench isolation) structures 6 specifying the active regions of the silicon substrate 1, which are an nMOS region 11 and a pMOS region herein 12, are formed.

Figure 8A:
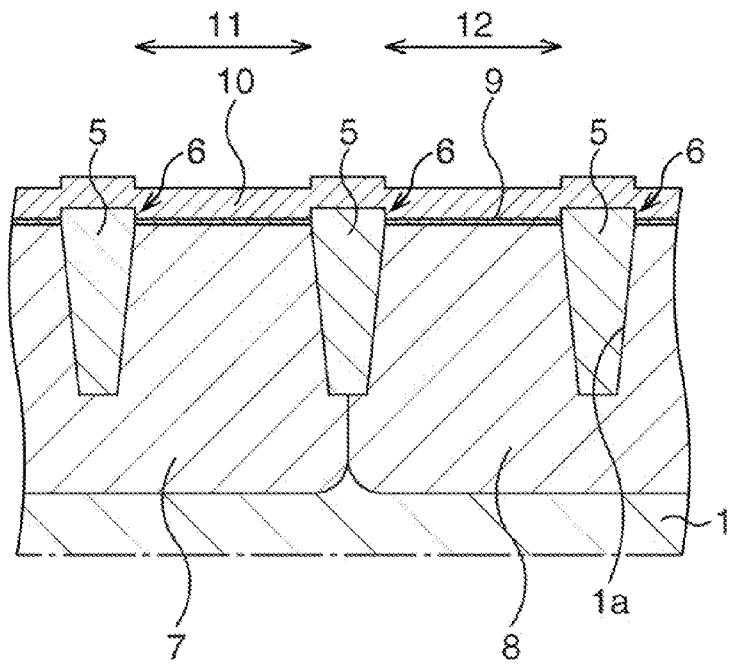

Next, as shown in FIG. 8A, a p-well 7, an n-well 8, a gate insulating film 9, and a polysilicon film 10 are formed.

More specifically, first, a resist mask (not shown) is formed so as to cover the pMOS region 12, and a p-type impurity, which is boron ($B^+$) herein, is introduced by ion implantation through the resist mask only into the nMOS region 11, under conditions including an acceleration energy of 150 keV and a dose of $1 \times 10^{13}/cm^2$.

Next, the resist mask is removed typically by asking, another resist mask (not shown) is formed so as to cover the nMOS region 11, and an n-type impurity, which is phosphorus ($P^+$) herein, is introduced by ion implantation through the resist mask only into the pMOS region 12, under conditions including an acceleration energy of 300 keV and a dose of $1 \times 10^{13}/cm^2$.

Next, the resist mask is removed typically by ashing, and the product is annealed for activation. By these processes, the p-well 7 is formed in the nMOS region 11, and the n-well 8 is formed in the pMOS region 12, so as to respectively surround portions of the STI element isolation structures 6.

Next, the surfaces of the nMOS region 11 and the pMOS region 12 are oxidized by dry process, so as to form a gate insulating film 9 composed of a silicon oxide film of typically as thick as 1.5 nm or around.

Next, on the gate insulating film 9, a polysilicon film 10 is formed typically by CVD typically to as thick as 100 nm or around.

Figure 8B:
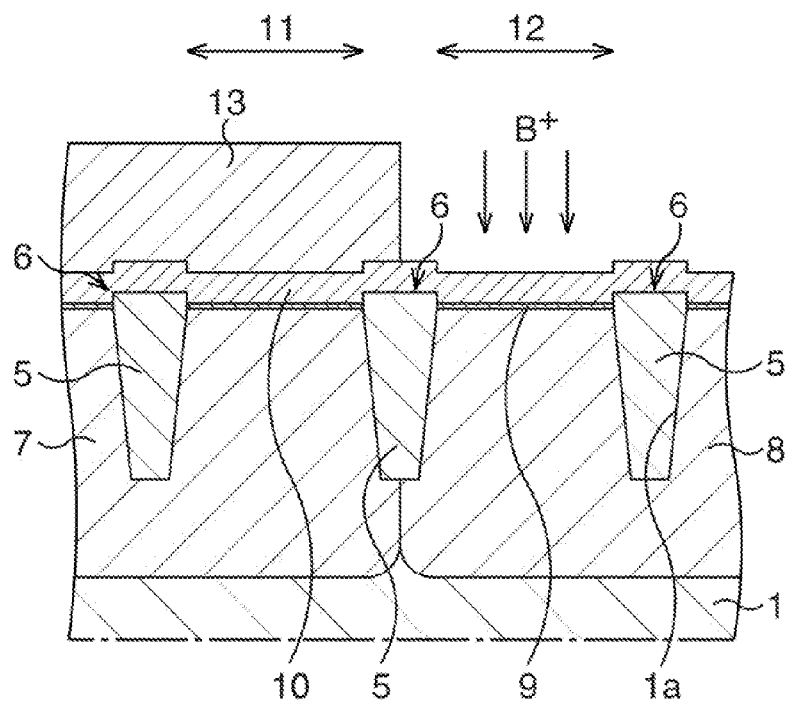

Next, as shown in FIG. 8B, a p-type impurity is introduced into a portion of the polysilicon film 10 corresponded to the pMOS region 12.

More specifically, a resist mask 13 is formed so as to cover the nMOS region 11, and a p-type impurity, which is typically boron ($B^+$), is introduced by ion implantation through the resist mask 13 only into the portion of the polysilicon film 10 corresponded to the pMOS region 12, under conditions including an acceleration energy of 5 keV and a dose of $6\times10^{15}/cm^2$. Thereafter, the resist mask 13 is removed typically by ashing.

Figure 9A:
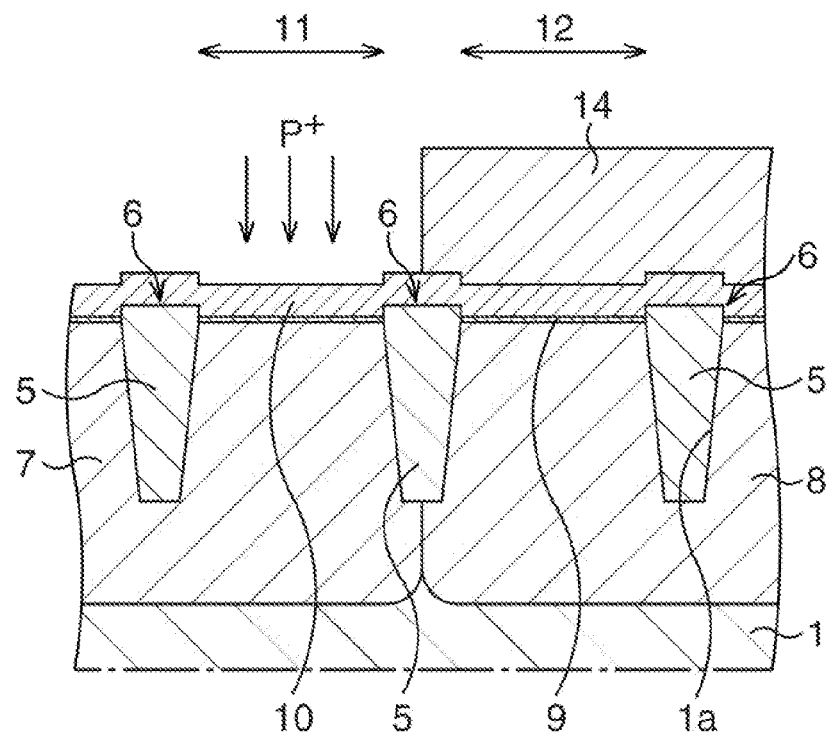

Next, as shown in FIG. 9A, an n-type impurity is introduced into a portion of polysilicon film 10 corresponded to the nMOS region 11.

More specifically, a resist mask 14 is formed so as to cover the pMOS region 12, and an n-type impurity, which is phosphorus ($P^+$) herein, is introduced by ion implantation through the resist mask 14 only into the portion of the polysilicon film 10 corresponded to the nMOS region 11, under conditions including an acceleration energy of 8 keV and a dose of $8\times10^{15}/cm^2$. Thereafter, the resist mask 14 is removed typically by asking.

Figure 9B:
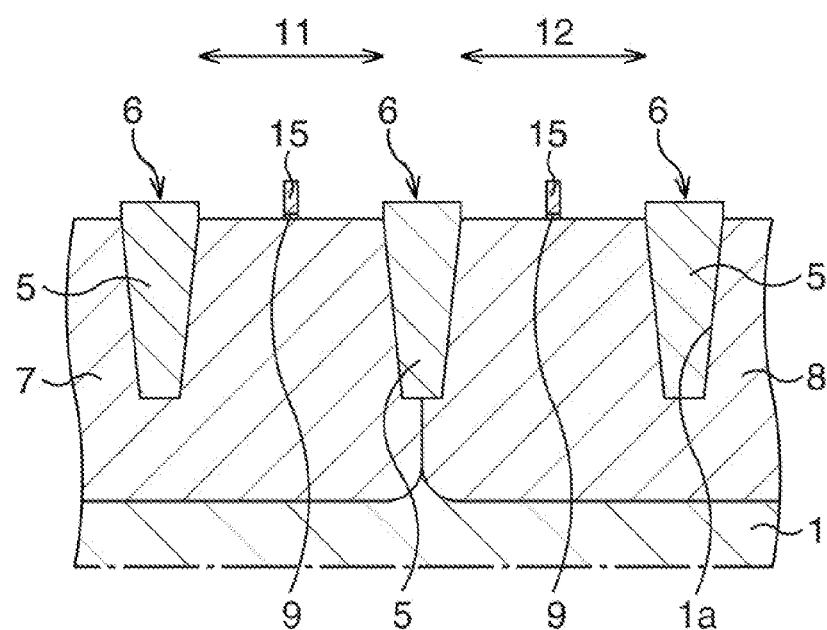

Next, as shown in FIG. 9B, gate electrodes 15 are formed.

More specifically, the polysilicon film 10 and the gate insulating film 9 are processed by lithography and dry etching. By these procedures, the gate electrodes 15 are formed on the silicon substrate 1 in the nMOS region 11 and the pMOS region 12, while placing the gate insulating film 9 thereunder.

Figure 10A:
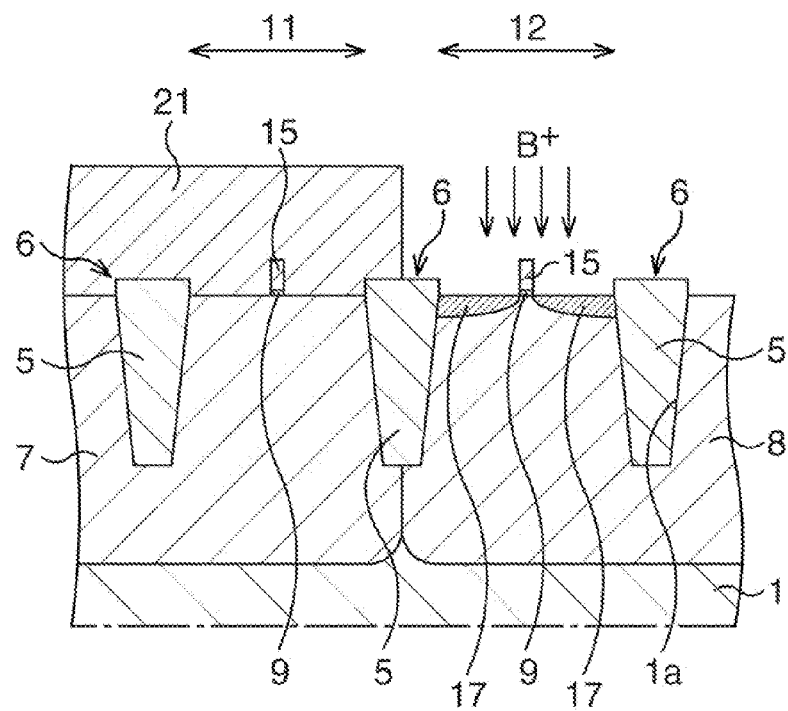

Next, as shown in FIG. 10A, p-extension regions 17 and pocket regions are sequentially formed in the pMOS region 12.

More specifically, a resist mask 21 is formed so as to cover the nMOS region 11, and a p-type impurity, which is boron ($B^+$) herein, is introduced by ion implantation through the resist mask 21 only into the pMOS region 12, under conditions including an acceleration energy of 0.5 keV and a dose of $1\times10^{15}/cm^2$. By these processes, the p-extension regions 17 are formed in the surficial portion of the silicon substrate 1, on both sides of the gate electrode 15 in the pMOS region 12.

Next, in order to form the unillustrated pocket regions, an n-type impurity, which is arsenic ($As^+$) herein, is introduced by ion implantation through the resist mask 21 only into the pMOS region 12 under conditions including an acceleration energy of 10 keV and a dose of $2\times10^{13}/cm^2$.

Thereafter, the resist mask 21 is removed typically by ashing.

Figure 10B:
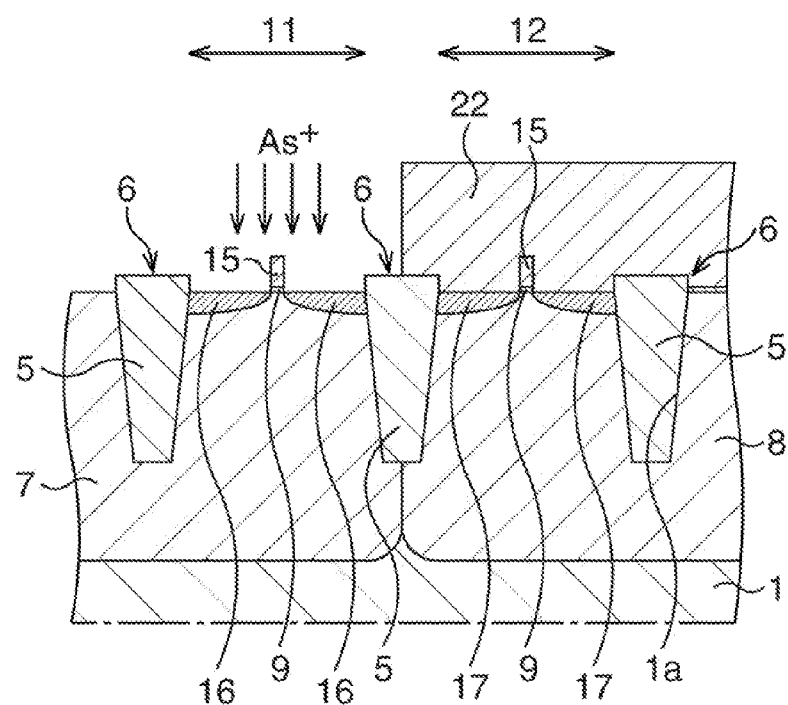

Next, as shown in FIG. 10B, n-extension regions 16 and pocket regions are sequentially formed in the nMOS region 11.

More specifically, a resist mask 22 is formed so as to cover the pMOS region 12, and an n-type impurity, which is arsenic ($As^+$) herein, is introduced by ion implantation through the resist mask 21 only into the nMOS region 11, under conditions including an acceleration energy of 3 keV and a dose of $1\times10^{15}/cm^2$. By these processes, the n-extension regions 16 are formed in the surficial portion of the silicon substrate 1, on both sides of the gate electrode 15 in the nMOS region 11.

Next, in order to form an unillustrated pocket regions, a p-type impurity, which is boron ($B^+$) herein, is introduced by ion implantation through the resist mask 22 only into the nMOS region 11, under conditions including an acceleration energy of 10 keV and a dose of $1\times10^{13}/cm^2$. Thereafter, the resist mask 22 is removed typically by ashing.

It is to be understood now that, although the extension regions 16, 17 (and the individual pocket regions) are formed only after the impurities are activated by annealing as described later, the drawings illustrate the extension regions 16, 17 as being formed in the process of ion implantation for the convenience's sake.

Figure 11A:
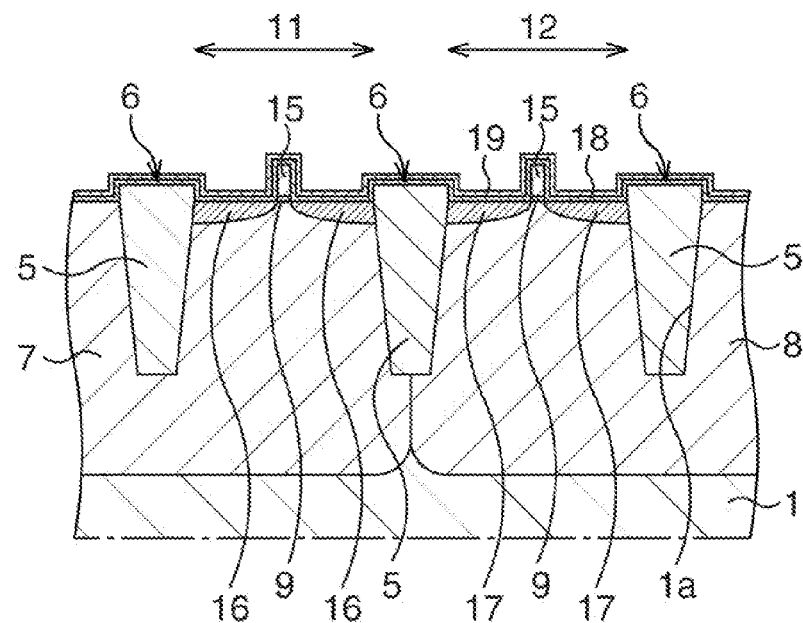

Next, as shown in FIG. 11A, a silicon oxide film 18 and a silicon nitride film 19 are sequentially formed over the entire surface of the silicon substrate 1.

More specifically, first, a silicon oxide film 18 is formed typically by CVD, to as thick as 5 nm or around over the entire surface of the silicon substrate 1, at a process temperature of 500° C. or higher and lower than 600° C.

Next, a silicon nitride film 19 is formed typically by CVD, to as thick as 30 nm or around on the silicon oxide film 19, at a process temperature of 500° C. or higher and lower than 600° C.

Figure 11B:
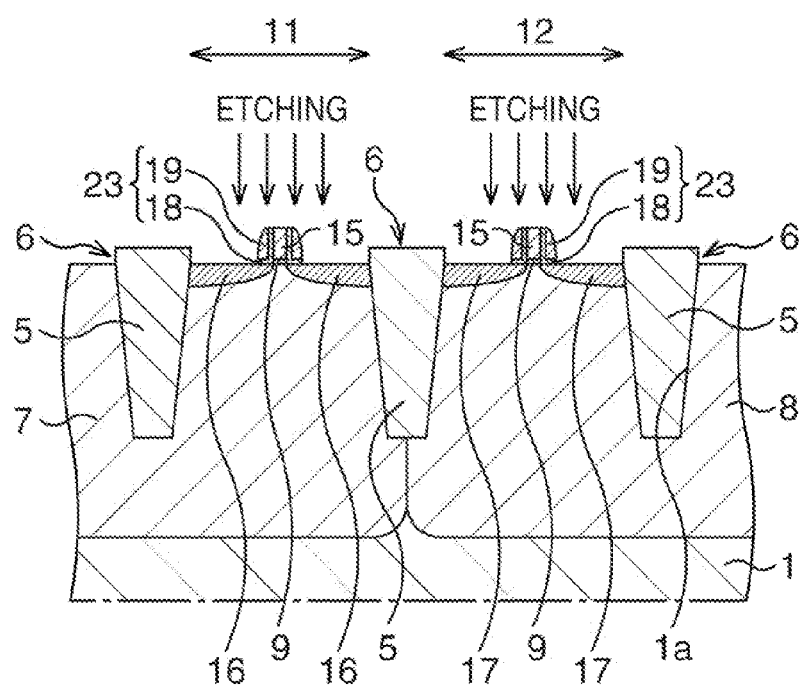

Next, as shown in FIG. 11B, sidewalls 23 are formed on both side faces of the individual gate electrodes 15.

More specifically, the entire surfaces of the silicon nitride film 19 and the silicon oxide film 18 are anisotropically etched by dry process (etchback) to thereby leave the silicon oxide film 18 and the silicon nitride film 18 only on the side faces of the gate electrodes 15. By these processes, sidewalls 23 are formed on the side faces of the gate electrodes 15.

Figure 12A:
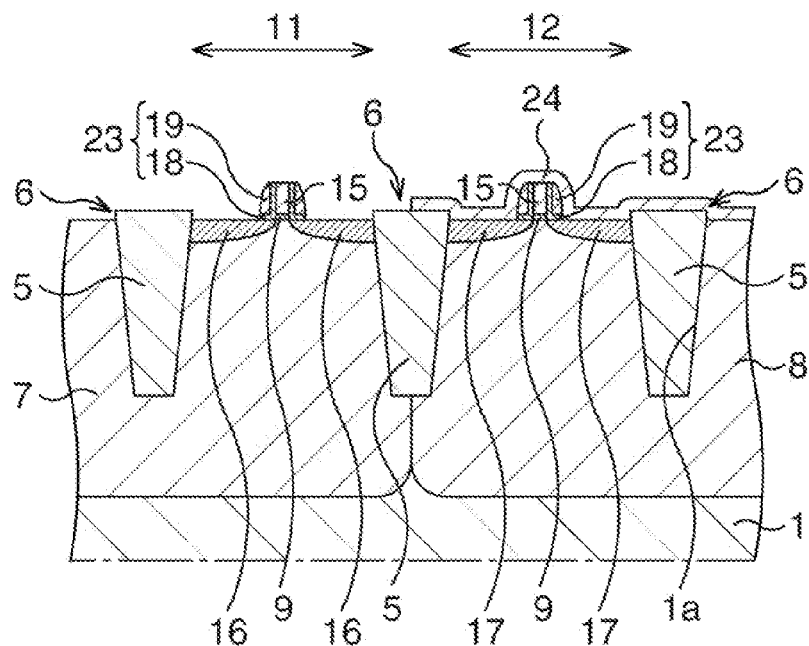

Next, as shown in FIG. 12A, an oxide film mask 24 is formed so as to cover the pMOS region 12.

More specifically, a silicon oxide film (not shown) is formed typically by CVD, to as thick as 30 nm or around over the entire surface of the silicon substrate 1 at lower temperatures (400° C. to 550° C. or around). The silicon oxide film is then processed by lithography and dry etching. By these processes, the oxide film mask 24 covering the pMOS region 12 and allowing the nMOS region 11 to expose is formed.

Figure 12B:
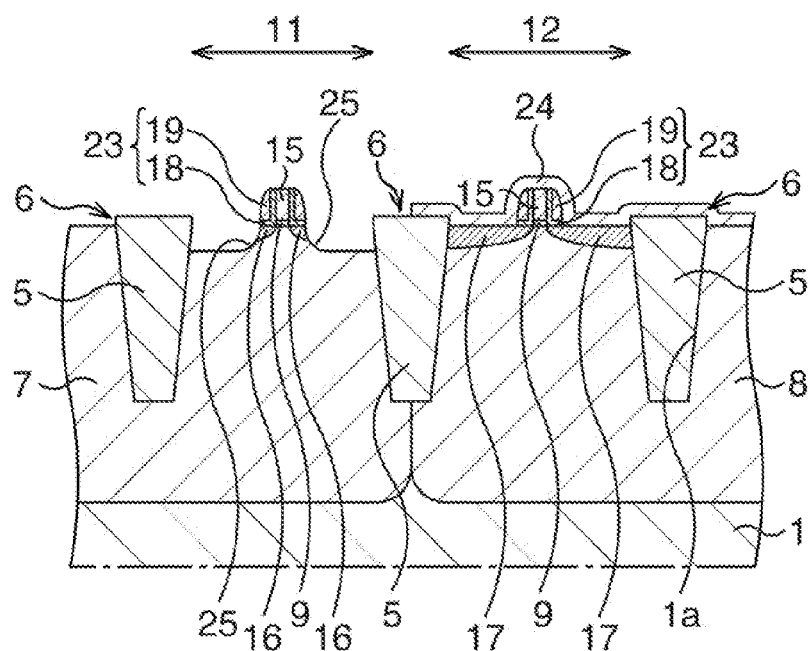

Next, as shown in FIG. 12B, recesses 25 are formed in the nMOS region 11.

More specifically, the surface of the silicon substrate 1 in the nMOS region 11 exposed out from the oxide film mask 24 is etched typically to as deep as 30 nm or around. In this process, the gate electrode 15 and the sidewalls 23 serve as a mask in the nMOS region 11, and thereby the recesses 25 are formed in the surficial portion of the silicon substrate 1 on both sides of the gate electrode 15 and the sidewalls 23.

Next, the surface of the silicon substrate 1 is treated typically using HF. The etching herein is proceeded so as to etch the thermal oxide film (silicon oxide film) to as much as 2 nm or around.

Figure 13A:
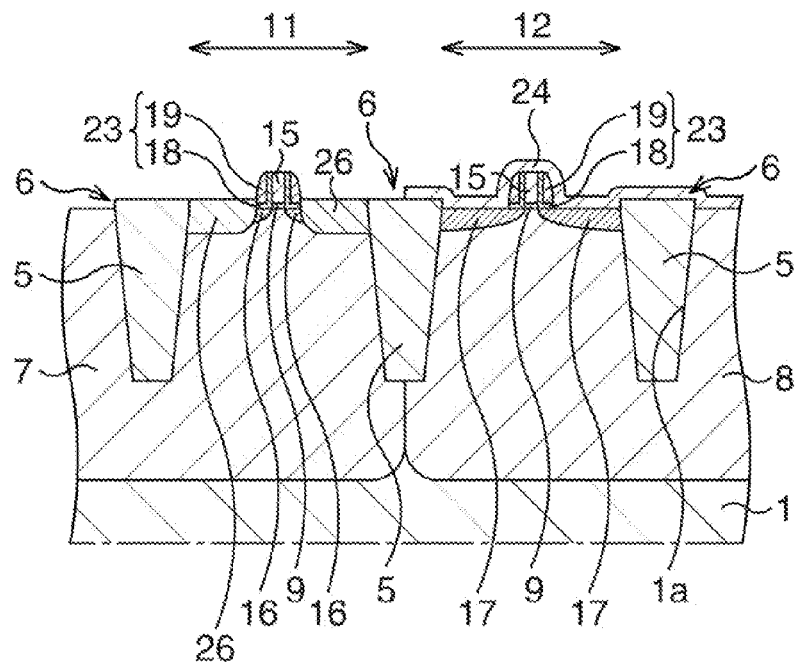

Next, as shown in FIG. 13A, a SiC layer 26 is formed so as to fill up the recesses 25.

More specifically, SiC, which is more specifically $Si_{1-x}C_x$, where $0.01 \leq x \leq 0.03$ (which means a C content of 1 to 3%), and still more specifically $Si_{0.98}C_{0.02}$ (x=0.02, which means a C content of 2%), is selectively grown by selective epitaxial growth method, using a mixed gas of $SiH_3CH_3$ and $P_2H_6/SiH_4.H_2/HCl$, or a mixed gas of $SiH_3CH_3$ and $P_2H_6.Si_2H_6.H_2/HCl$ as a source gas, at a growth temperature of 600° C. or lower, in the recesses 25 having the silicon surface exposed therein. SiC may contain some other elements. By these processes, the SiC layer 26 is formed so as to fill up the recesses 25 typically to as thick as 30 nm or around.

In this process, the dose of phosphorus (P) into the SiC layer 26 may typically be 1 mΩ·cm or around on the resistivity basis, allowing the SiC layer 26 to function as the source/drain regions of the n-channel MOS transistor.

In the above-described selective epitaxial growth, the SiC layer 26 may alternatively be formed by repeating a process of forming $Si_{0.98}C_{0.02}$ over the entire surface of the silicon substrate 1 using a mixed gas excluding HCl as a source gas, and a process of removing the portion of $Si_{0.98}C_{0.02}$ (in a state of polycrystal or kernel) deposited on the region not fallen on the recesses 25 by wet etching using ammonium hydroperoxide (ammonia and hydrogen peroxide) as a main ingredient. Still alternatively, the SiC layer 26 may be formed by similarly depositing $Si_{0.98}C_{0.02}$ over the entire surface, and then by removing the polycrystal or the kernel on the insulating film using an etching gas containing Cl element, in a repetitive manner or at one time.

Figure 13B:
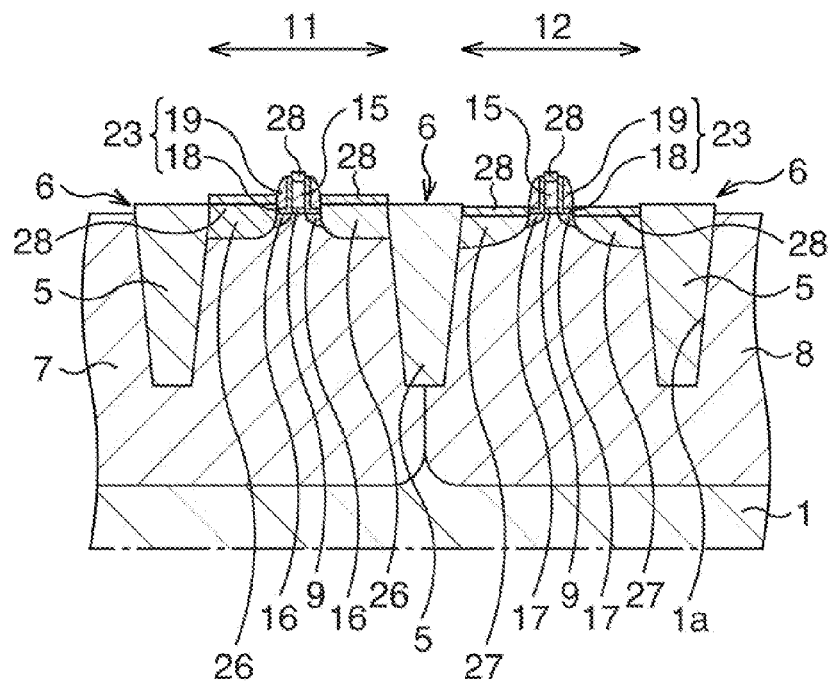

Next, as shown in FIG. 13B, source/drain regions 27 are formed in the pMOS region 12, and the product is subjected to the SALICIDE process.

More specifically, first, the oxide film mask 24 is removed. The oxide film mask 24 was approximately 30 nm thick when it was formed, but has been reduced in the thickness typically to as thin as 10 nm or around, after the surface treatment using HF. The oxide film mask 24 is removed typically by wet etching using HF.

Next, a resist mask (not shown) is formed so as to cover the nMOS region 11, and a p-type impurity, which is boron ($B^+$) herein, is introduced by ion implantation through the resist mask only into the pMOS region 12, under conditions including an acceleration energy of 0.5 keV and a dose of $1\times10^{15}/cm^2$.

The silicon substrate 1 is then subjected to ultra-short-time annealing at a maximum temperature of 950° C., which is typically spike annealing, so as to activate the implanted impurities. By these processes, the p-source/drain regions 27 are formed in the surficial portion of the silicon substrate 1 as being adjacent to the sidewalls 23 in the pMOS region 12, and as being partially overlapped with the p-extension region 17. By the annealing, the various impurities already incorporated by the ion implantation in the preceding steps (impurities in the extension regions 16, 17, and impurities in the individual pocket regions) may be activated at the same time.

Thereafter, the resist mask is removed typically by asking.

Next, an insulating film is supplementally formed to the sidewall 23, because the sidewalls 23 have been thinned by the various processes.

More specifically, a silicon nitride film (not shown) is deposited typically by CVD to as thick as approximately 20 nm over the entire surface of the silicon substrate 1, and the entire surface of the silicon nitride film is then anisotropically etched (etchback), to thereby leave the silicon nitride film on the sidewalls 23.

Next, a metal used for silicidation, which is a Ni alloy (not shown) herein, is formed typically by sputtering over the entire surface of the silicon substrate 1, typically to as thick as 10 nm or around. The silicon substrate 1 is then subjected to RTP typically at around 300° C. so as to allow Si to react with the Ni alloy. Unreacted portion of the Ni alloy is then removed typically by persulfuric acid treatment. To further promote reduction in resistivity of silicide, additional annealing is carried out typically at 400° C. to 500° C. By these processes, silicide layers 28 are formed respectively on the upper surfaces of the gate electrodes 15, the upper surface of the SiC layer 26, and the upper surfaces of the p-source/drain regions 27.

Figure 14A:
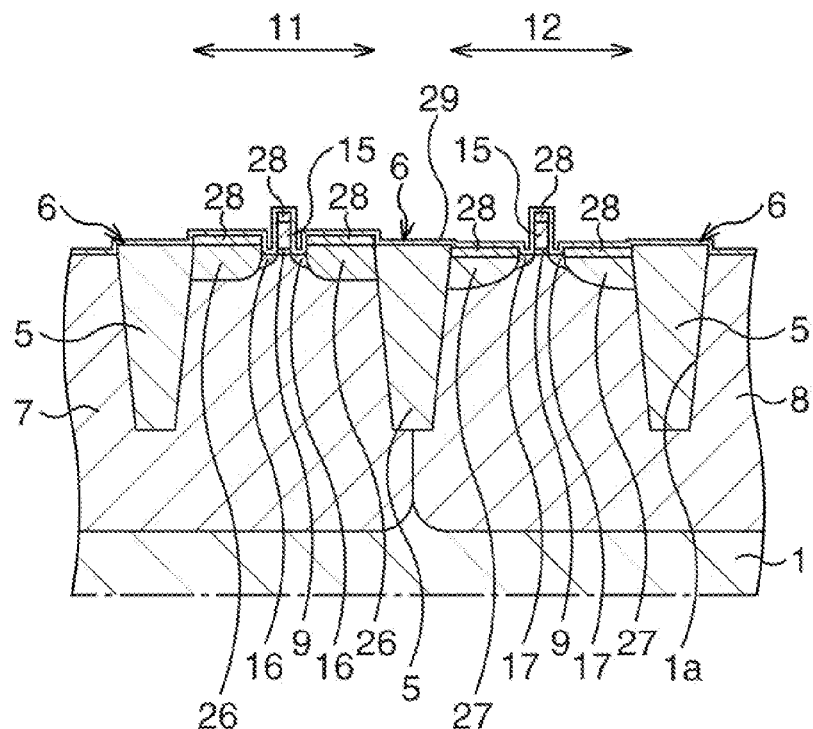

Next, as shown in FIG. 14A, the sidewalls 23 are removed, and a silicon nitride film 29 is formed.

More specifically, first, the sidewalls 23 are removed by dry etching using an etching gas containing $CF_4/O_2$ as major constituents.

Next, an insulating film having expandability, which is the silicon nitride film 29 herein, is formed over the entire surface of the silicon substrate 1 typically by plasma CDV, using $SiH_4/NH_3$ as a source gas under conditions including a power of 100 W to 300 W and a substrate temperature of 400° C. to 500° C., to as thick as 10 to 20 nm, typically 10 nm or around.

Figure 14B:
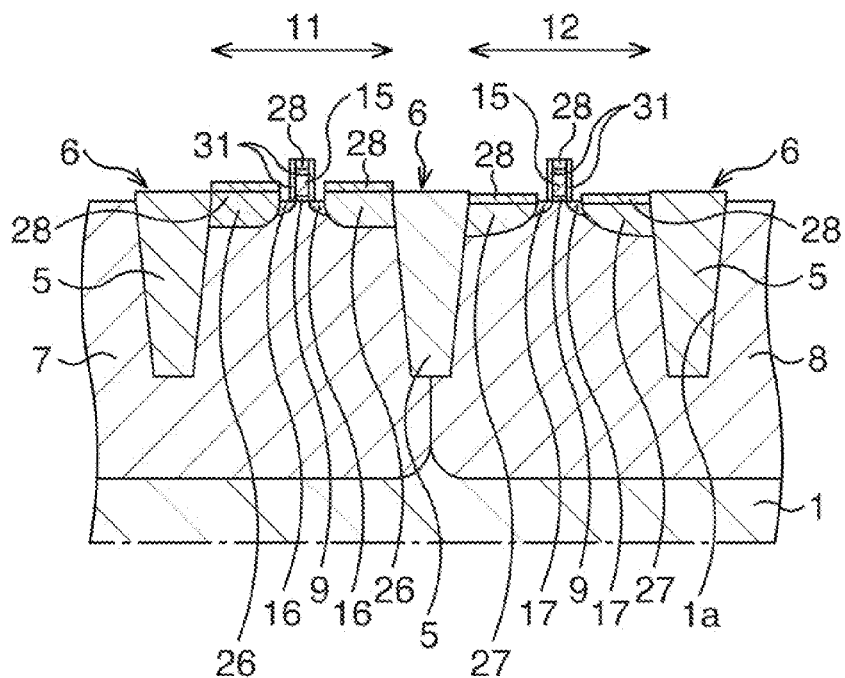

Next, as shown in FIG. 14B, first sidewalls 31 are formed on the side faces of the gate electrodes 15.

More specifically, the entire surface of the silicon nitride film 29 is anisotropically etched by dry process (etchback) to thereby leave the silicon nitride film 29 only on the side faces of the individual gate electrodes 15. By these processes, the first sidewalls 31 having expandability are formed on the side faces of the individual gate electrodes 15. The first sidewalls 31 are formed typically to as thick as 10 nm to 20 nm or around, which is typically 15 nm or around herein, so as to adjust the absolute intrinsic stress of 2.5 GPa to 4.0 GPa or around, which is typically 3.0 GPa or around herein.

Figure 15:
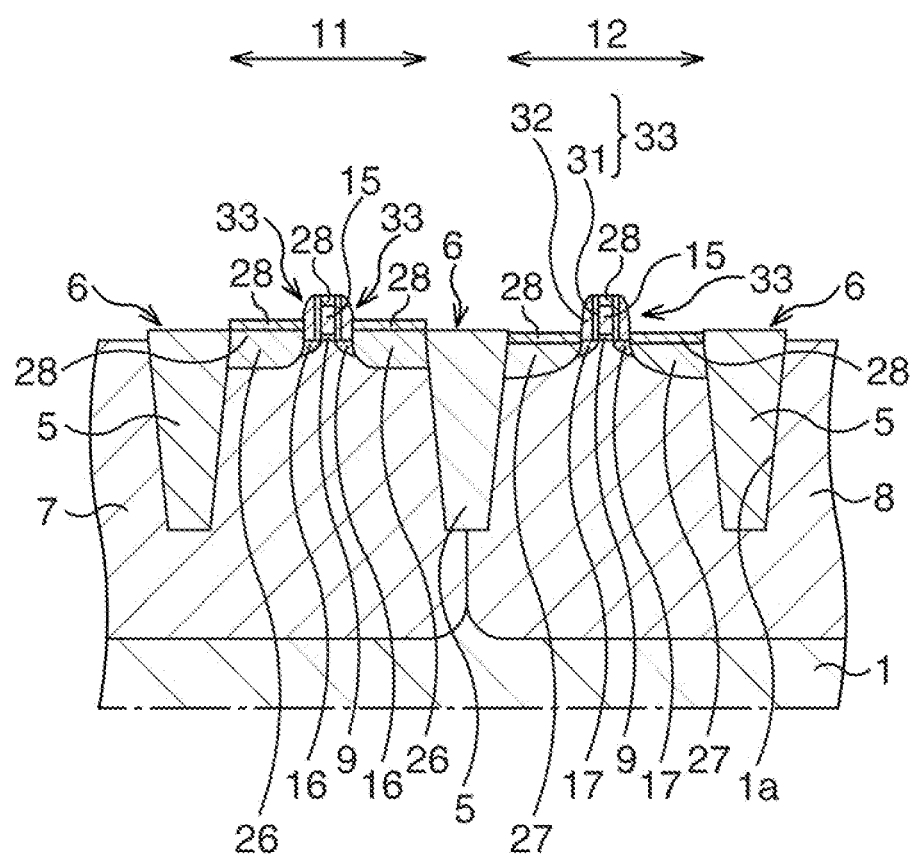

Next, as shown in FIG. 15, second sidewalls 32 are formed.

More specifically, an insulating film having stress smaller than that of silicon nitride film 29 composing the first sidewalls 31, which is a silicon oxide film (not shown) herein, is formed over the entire surface of the silicon substrate 1 typically by plasma CVD to as thick as 20 nm to 40 nm, which is typically 30 nm or around. The entire surface of the silicon oxide film is then anisotropically etched (etchback) so as to leave the silicon oxide film only on the individual first sidewalls 31. By these processes, the second sidewalls 32 are formed on the individual first sidewalls 31. The second sidewalls 32 are formed to as thick as 20 nm to 40 nm or around, which is typically 30 nm or around, considering also the requirement of keeping the first sidewalls 31 and the SiC layer 26 away from each other. In this way, sidewalls 33 are configured by the first sidewalls 31 and the second sidewalls 32.

The process is then followed by formation of insulating interlayers, contact holes, interconnects and so forth, thereby the CMOS transistor of this embodiment is completed.

In this embodiment, in the n-channel MOS transistor formed in the nMOS region 11, the SiC layer 26 is formed in the source/drain regions of the silicon substrate 1, and the first sidewalls 31 having expandability and the second sidewalls 32 composed of a film having a stress smaller than that composing the first sidewalls 31 are formed on the side faces of the gate electrodes 15 formed on the silicon substrate 1 while placing the gate insulating film 9 thereunder, wherein the SiC layer 26 is positioned apart from the first sidewalls 31 as being isolated by the second sidewalls 32.

In the n-channel MOS transistor formed in the nMOS region 11, tensile stress is applied in the direction of channel width, and compressive stress is applied in the perpendicular (depth-wise) direction, respectively to sufficient degrees. In this embodiment, the first sidewalls 31 are positioned apart from the SiC layer 26 as being isolated by the second sidewalls 32 composed of a film having stress smaller than that of the first sidewalls 31, so that stress of the first sidewalls 31 is exerted not to the SiC layer 26, but directly to Si composing the silicon substrate 1 right under the first sidewalls 31. In this case, the second sidewalls 32 smaller in stress than the SiC layer 26 may act as a kind of cushion component, and thereby the SiC layer 26 is prevented from producing crystal defect.

This embodiment has explained the case where the first sidewalls 31 composed of a stress film was formed after completion of the silicidation process. This is because any heat applied to the first sidewalls in the silicidation process may alter the stress conditions. For this reason, the sidewalls composed of a stress film may be formed also in other process depending on conditions such as annealing temperature. For example, the sidewalls composed of a stress film may be formed in the substrate before the step of forming the trenches in which SiC is grown, and the sidewall may be used as a substitute for the first sidewalls of this embodiment, without being removed after the SiC layer is epitaxially grown.

As has been described in the above, according to this embodiment, strain at the channel region of the n-channel MOS transistor may appropriately be increased without causing damage to the SiC layer 26, and thereby carrier injection rate may be improved. By virtue of this configuration, transistor characteristics may dramatically be improved while being adapted also to recent narrower channel width.

A configuration of a CMOS transistor according to this embodiment will be explained, together with a method of manufacturing the same.

FIG. 16A to FIG. 20B are schematic sectional views sequentially showing steps of a method of manufacturing the CMOS transistor according to a second embodiment.

First, the steps shown in FIG. 6A to FIG. 11B are carried out similarly to as described in the first embodiment.

Figure 16A:
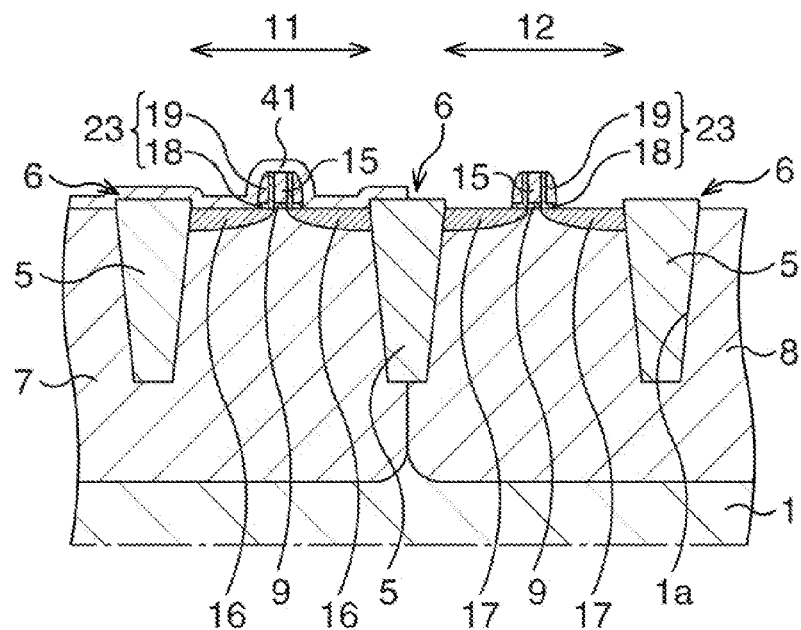
FIGS. 16A to 20B are schematic sectional views sequentially showing representative steps of manufacturing a CMOS transistor according to a second embodiment.

Next, as shown in FIG. 16A, an oxide film mask 41 is formed so as to cover the nMOS region 11.

More specifically, a silicon oxide film (not shown) is formed typically by CVD, to as thick as 30 nm or around over the entire surface of the silicon substrate 1 at lower temperatures (400° C. to 550° C. or around). The silicon oxide film is then processed by lithography and dry etching. By these processes, the oxide film mask 41 covering the nMOS region 11 and allowing the pMOS region 12 to expose is formed.

Figure 16B:
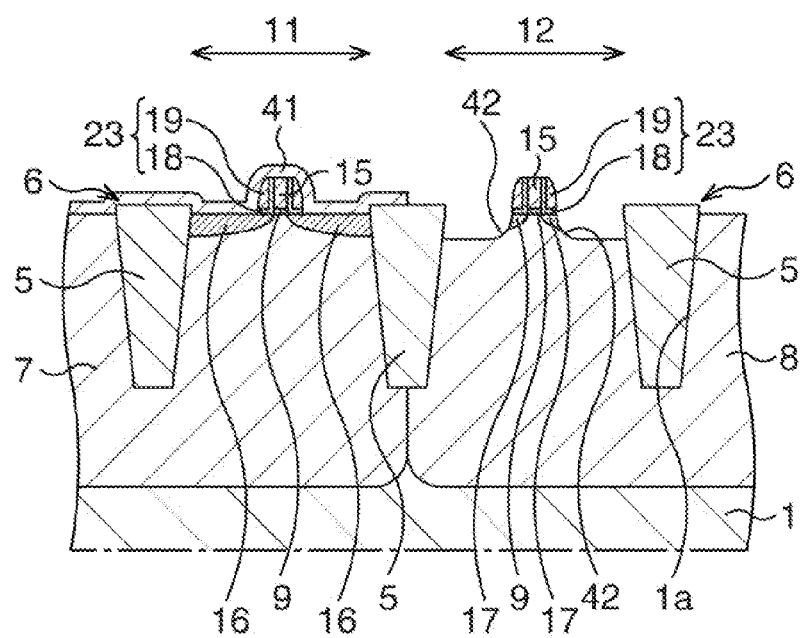

Next, as shown in FIG. 16B, recesses 42 are formed in the pMOS region 12.

More specifically, the surface of the silicon substrate 1 in the pMOS region 12 exposed out from the oxide film mask 41 is etched typically to as deep as 40 nm or around. In this process, the gate electrode 15 and the sidewalls 23 serve as a mask in the pMOS region 12, and thereby the recesses 42 are formed in the surficial portion of the silicon substrate 1 on both sides of the gate electrode 15 and the sidewalls 23.

Figure 17A:
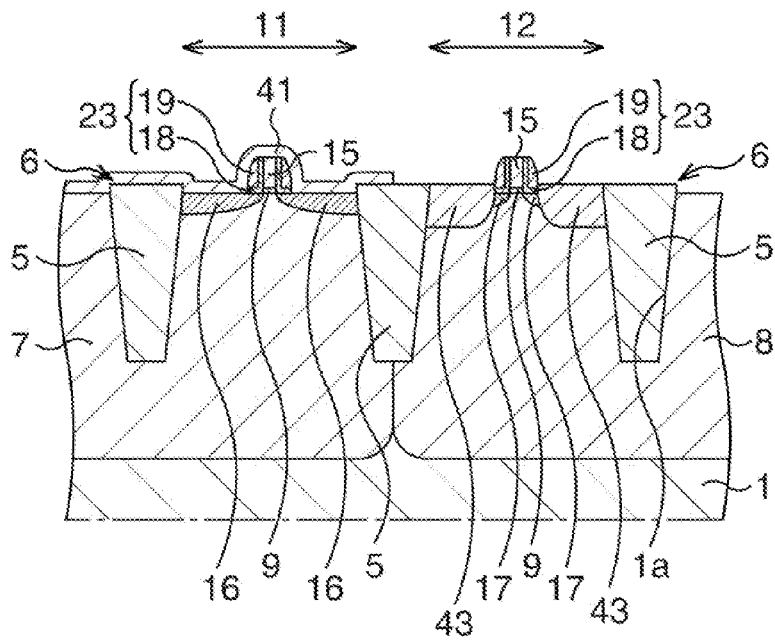

Next, as shown in FIG. 17A, a SiGe layer 43 is formed so as to fill up the recesses 42.

More specifically, SiGe, which is more specifically $Si_{1-y}Ge_y$, where $0.15 \leq y \leq 0.25$, and still more specifically $Si_{0.80}Ge_{0.20}$ (y=0.20, which means a Ge content of 20%), is selectively grown by selective epitaxial growth method, using a mixed gas of $SiH_4/GeH_4/H_2/HCl/B_2H_6$ as a source gas, at a growth temperature of 550° C. to 600° C. or lower, in the recesses 42 having the silicon surface exposed therein. By these processes, the SiGe layer 43 is formed so as to fill up the recesses 42 typically to as thick as 40 nm or around. The SiGe layer 43 will function as the source/drain regions of the p-channel MOS transistor. The SiGe layer 43 herein may additionally contain C to give SiGeC.

Figure 17B:
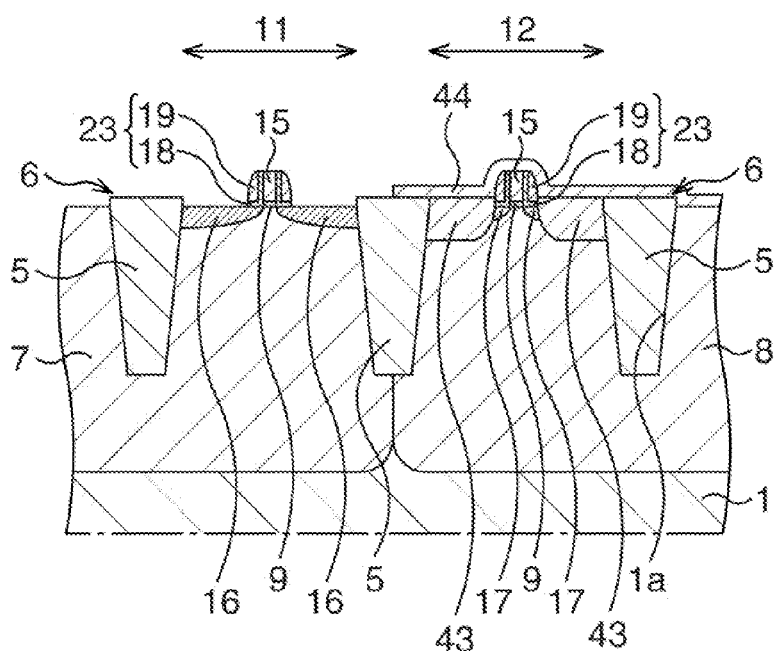

Next, as shown in FIG. 17B, the oxide film mask 42 is removed, and an oxide film mask 44 is formed so as to cover the pMOS region 12.

More specifically, first, the oxide film mask 42 is removed typically by wet etching using HF.

Next, a silicon oxide film (not shown) is formed typically by CVD, to as thick as 40 nm or around over the entire surface of the silicon substrate 1 at lower temperatures (400° C. to 550° C. or around). The silicon oxide film is then processed by lithography and dry etching. By these processes, the oxide film mask 44 covering the pMOS region 12 and allowing the nMOS region 11 to expose is formed.

Figure 18A:
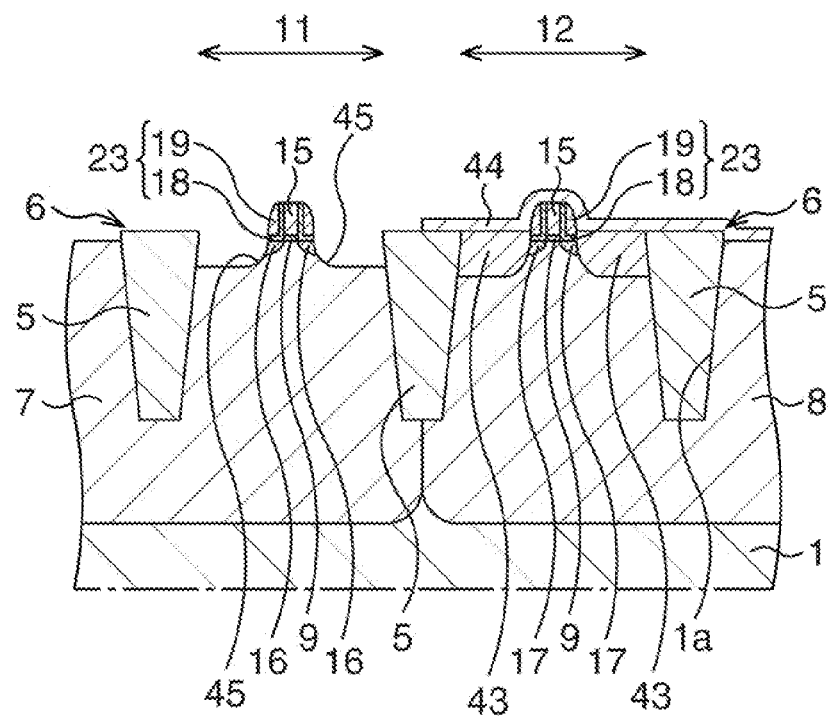

Next, as shown in FIG. 18A, recesses 45 are formed in the nMOS region 11.

More specifically, the surface of the silicon substrate 1 in the nMOS region 11, exposed out from the oxide film mask 44 is etched typically to as deep as 30 nm or around. In this process, the gate electrode 15 and the sidewalls 23 serve as a mask in the nMOS region 11, and thereby the recesses 45 are formed in the surficial portion of the silicon substrate 1 on both sides of the gate electrode 15 and the sidewalls 23.

Next, the surface of the silicon substrate 1 is treated typically using HF. The etching herein is proceeded so as to etch the thermal oxide film (silicon oxide film) to as much as 2 nm or around.

Figure 18B:
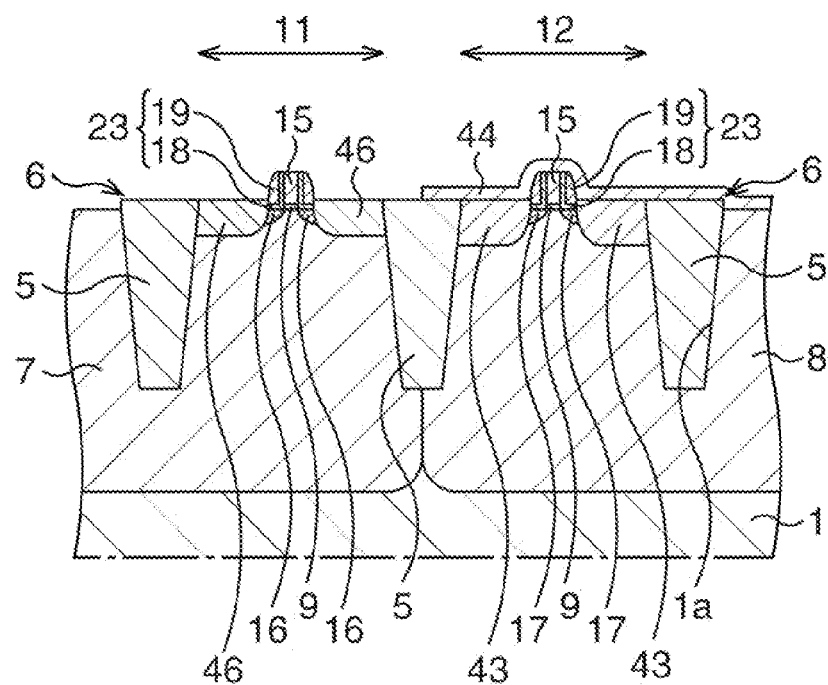

Next, as shown in FIG. 18B, a SiC layer 46 is formed so as to fill up the recesses 45.

More specifically, SiC, which is more specifically $Si_{1-x}C_x$, where $0.01 \leq x \leq 0.03$, and still more specifically $Si_{0.98}C_{0.02}$ (x=0.02, which means a C content of 2%), is selectively grown by selective epitaxial growth method, using a mixed gas of $SiH_3CH_3$ and $P_2H_6/SiH_4.H_2/HCl$, or a mixed gas of $SiH_3CH_3$ and $P_2H_6.Si_2H_6.H_2/HCl$ as a source gas, at a growth temperature of 600° C. or lower, in the recesses 45 having the silicon surface exposed therein. By these processes, the SiC layer 46 is formed so as to fill up the recesses 45 typically to as thick as 30 nm or around. In this process, the dose of phosphorus (P) into the SiC layer 46 may typically be 1 mΩ·cm or around on the resistivity basis, allowing the SiC layer 46 to function as the source/drain regions of the n-channel MOS transistor.

In the above-described selective epitaxial growth, the SiC layer 46 may alternatively be formed by repeating a process of forming $Si_{0.98}C_{0.02}$ over the entire surface of the silicon substrate 1 using a mixed gas excluding HCl as a source gas, and a process of removing the portion of $Si_{0.98}C_{0.02}$ (in a state of polycrystal or kernel) deposited on the region not fallen on the recesses 45 by wet etching using HCl as a main ingredient.

Figure 19A:
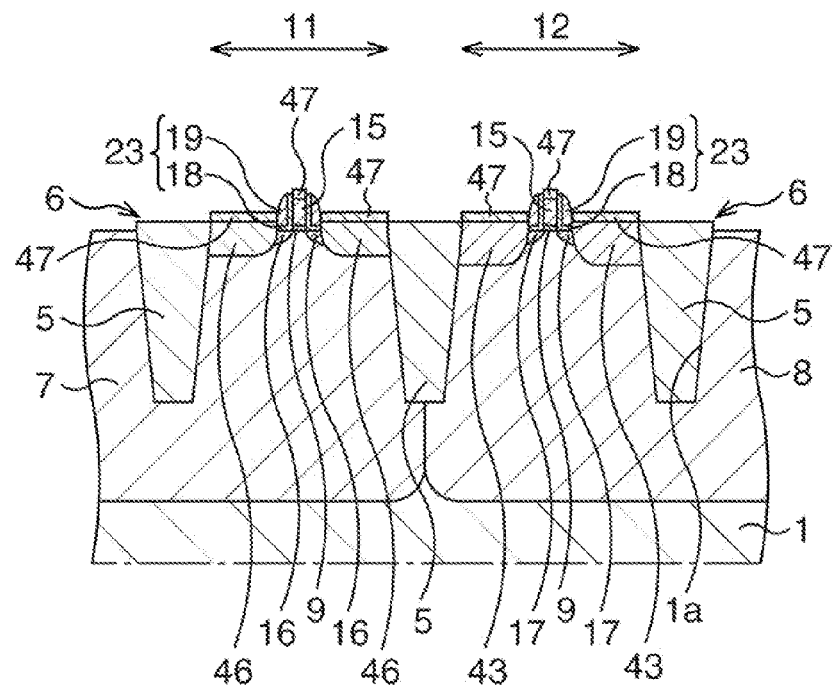

Next, as shown in FIG. 19A, the oxide film mask 44 is removed, and the product is subjected to the SALICIDE process.

More specifically, first, the oxide film mask 44 is removed typically by wet etching using HF.

Next, an insulating film is supplementally formed to the sidewall 23, because the sidewalls 23 have been thinned by the various processes.

More specifically, a silicon nitride film (not shown) is deposited typically by CVD to as thick as approximately 20 nm over the entire surface of the silicon substrate 1, and the entire surface of the silicon nitride film is then anisotropically etched (etchback), to thereby leave the silicon nitride film on the sidewalls 23.

Next, a metal used for silicidation, which is a Ni alloy (not shown) herein, is formed typically by sputtering over the entire surface of the silicon substrate 1, typically to as thick as 10 nm or around. The silicon substrate 1 is then subjected to RTP typically at around 300° C. so as to allow Si to react with the Ni alloy. Unreacted portion of the Ni alloy is then removed typically by persulfuric acid treatment. To further promote reduction in resistivity of silicide, additional annealing is carried out typically at 400° C. to 500° C. By these processes, silicide layers 47 are formed respectively on the upper surfaces of the gate electrodes 15, the upper surface of the SiC layer 46, and the upper surfaces of the SiGe layer 43.

Figure 19B:
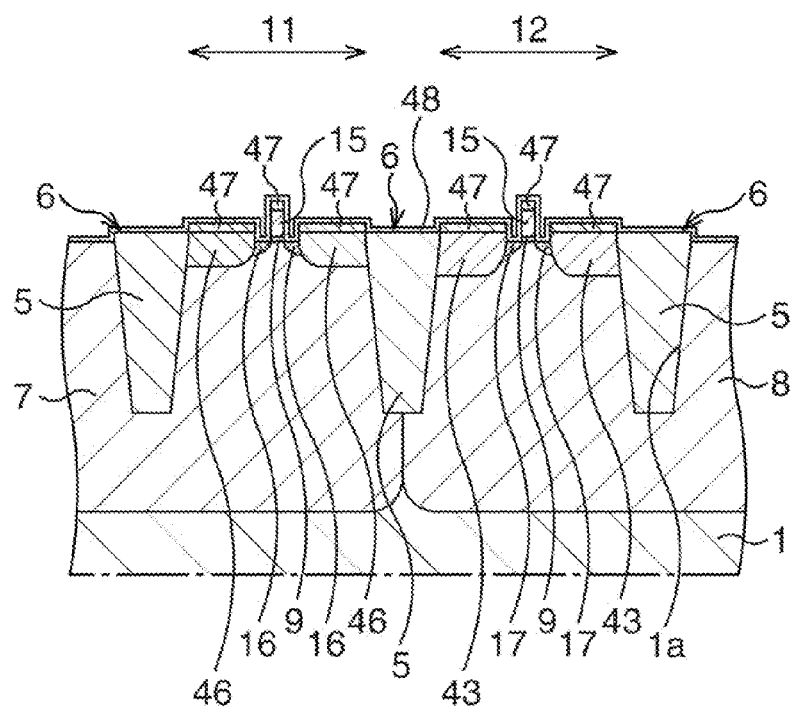

Next, as shown in FIG. 19B, the sidewalls 23 is removed, and then a silicon nitride film 48 is formed.

More specifically, first, the sidewalls 23 are removed by dry etching using an etching gas containing $CF_4/O_2$ as major constituents.

Next, an insulating film having expandability, which is the silicon nitride film 48 herein, is formed over the entire surface of the silicon substrate 1 typically by plasma CDV, using $SiH_4/NH_3$ as a source gas under conditions including a power of 100 W to 300 W and a substrate temperature of 400° C. to 500° C., to as thick as 10 to 20 nm, typically 10 nm or around.

Figure 20A:
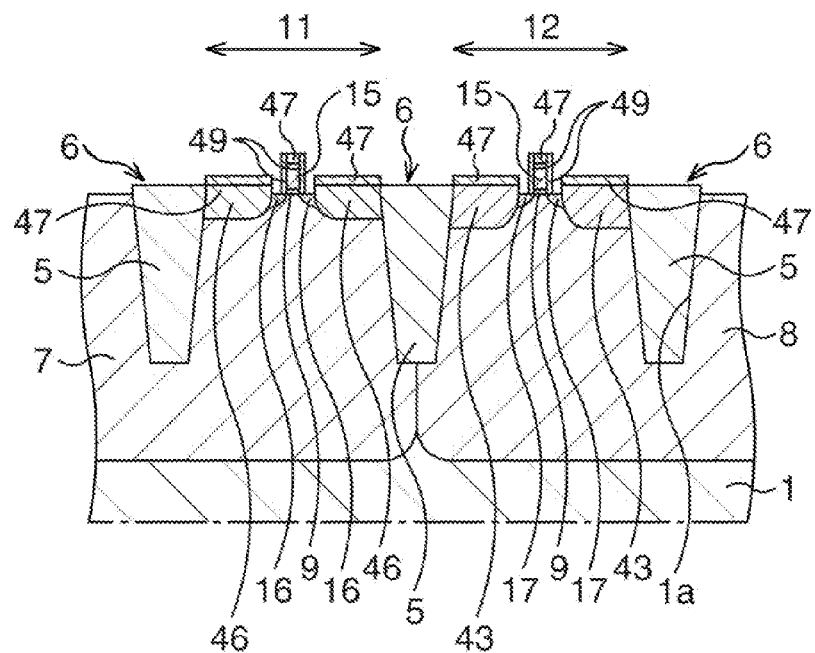

Next, as shown in FIG. 20A, first sidewalls 49 are formed on the side faces of the gate electrodes 15.

More specifically, the entire surface of the silicon nitride film 48 is anistropically etched by dry process (etchback) to thereby leave the silicon nitride film 48 only on the side faces of the individual gate electrodes 15. By these processes, the first sidewalls 49 having expandability are formed on the side faces of the individual gate electrodes 15. The first sidewalls 49 are formed typically to as thick as 10 nm to 20 nm or around, which is typically 15 nm or around herein, so as to adjust the absolute intrinsic stress of 2.5 GPa to 4.0 GPa or around, which is typically 3.0 GPa or around herein.

Figure 20B:
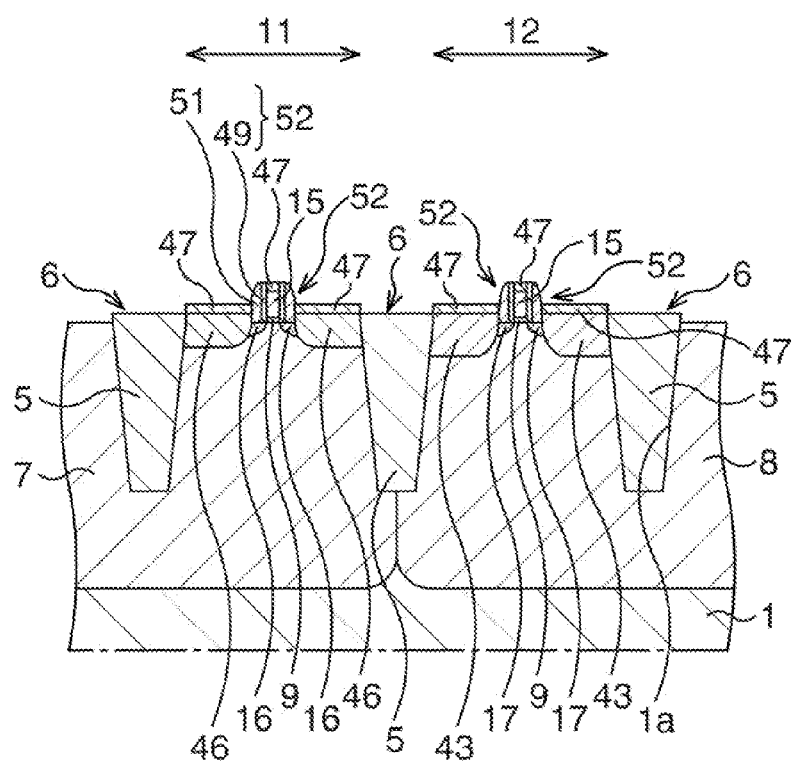

Next, as shown in FIG. 20B, second sidewalls 51 are formed.

More specifically, an insulating film having stress smaller than that of silicon nitride film 48 composing the first sidewalls 49, which is a silicon oxide film (not shown) herein, is formed over the entire surface of the silicon substrate 1 typically by plasma CVD to as thick as 30 nm or around. The entire surface of the silicon oxide film is then anisotropically etched (etchback) so as to leave the silicon oxide film only on the individual first sidewalls 48. By these processes, the second sidewalls 51 are formed on the individual first sidewalls 48. The second sidewalls 51 are formed to as thick as 20 nm to 40 nm or around, which is typically 30 nm or around, considering also the requirement of keeping the first sidewalls 49 and the SiC layer 46 away from each other. In this way, the sidewalls 52 are configured by the first sidewalls 49 and the second sidewalls 51.

The process is then followed by formation of insulating interlayers, contact holes, interconnects and so forth, thereby the CMOS transistor of this embodiment is completed.

In this embodiment, in the n-channel MOS transistor formed in the nMOS region 11, tensile stress is applied in the direction of channel length of the channel region, tensile stress is applied in the direction of channel width, and compressive stress is applied in the perpendicular direction (depth-wise direction), respectively to sufficient degrees. In this embodiment, the first sidewalls 49 are positioned apart from the SiC layer 46 as being isolated by the second sidewalls 51 composed of a film having stress smaller than that of the first sidewalls 49, so that stress of the first sidewalls 49 is exerted not to the SiC layer 46, but directly to Si composing the silicon substrate 1 right under the first sidewalls 49. In this case, the second sidewalls 51 smaller in stress than the SiC layer 46 may act as a kind of cushion component, and thereby the SiC layer 46 is prevented from producing crystal defect.

On the other hand, in the p-channel MOS transistor formed in the pMOS region 12, the SiGe layer 43 is formed in the source/drain regions in the silicon substrate 1, and the first sidewalls 49 having expandability and the second sidewalls 51 composed of a film having a stress smaller than that composing the first sidewalls 49 are formed on the side faces of the gate electrode 15 formed on the silicon substrate 1 while placing the gate insulating film 9 thereunder, wherein the SiGe layer 43 is positioned apart from the first sidewalls 49 as being isolated by the second sidewalls 51.

In the p-channel MOS transistor formed in the pMOS region 12, tensile stress is applied in the direction of channel width to a sufficient degree. Now, compressive stress is ensured in the direction of channel length of the channel region, contributed by action of the SiGe layer 43 and the STI element isolation structure 6. Tensile stress is similarly ensured also in the perpendicular direction (depth-wise direction) of the channel region. In this embodiment, the first sidewalls 49 are positioned apart from the SiC layer 46 as being isolated by the second sidewalls 51 composed of a film having stress smaller than that of the first sidewalls 49, so that stress of the first sidewalls 49 is exerted not to the SiC layer 46, but directly to Si composing the silicon substrate 1 right under the first sidewalls 49. In this case, the second sidewalls 51 smaller in stress than the SiC layer 46 may act as a kind of cushion component, and thereby the SiC layer 46 is prevented from producing crystal defect.

As has been described in the above, according to this embodiment, strain at the individual channel regions of the n-channel MOS transistor and the p-channel MOS transistor may appropriately be increased without causing damage to the SiC layer 46, and thereby carrier injection rate may be improved. By virtue of this configuration, transistor characteristics may dramatically be improved while being adapted also to recent narrower channel width.

What is claimed is:

1. A method of manufacturing a semiconductor device, comprising:
   forming a gate electrode over a semiconductor substrate while placing a gate insulating film in between;
   forming a first sidewall over the side faces of the gate electrode;
   forming a recess by etching the semiconductor substrate using the gate electrode and the first sidewall as a mask;
   forming a semiconductor layer in the recess, the semiconductor layer including SiC, and a C content of the semiconductor layer being 1% to 3%,
   removing the first sidewall after forming the semiconductor layer,
   forming a second sidewall including a stress film over the side face of the gate electrode after removing the first sidewall, the second sidewall is located apart from the semiconductor layer, and
   forming a third sidewall on the second sidewall.

2. The method of manufacturing a semiconductor device according to claim 1, wherein the semiconductor layer is formed as being positioned apart from the first sidewall while placing the second sidewall in between.

3. The method of manufacturing a semiconductor device according to claim 1 wherein the stress film has expandability.

4. The method of manufacturing a semiconductor device according to claim 1, wherein the stress film has an absolute intrinsic stress value of 2.5 GPa or larger and 4.0 GPa or smaller.

5. The method of manufacturing a semiconductor device according to claim 1, wherein the second sidewall includes a film having stress smaller than that of the first sidewall.

6. A method of manufacturing a semiconductor device, comprising:
   forming a gate electrode over a semiconductor substrate while placing a gate insulating film in between;
   forming a first sidewall over the side faces of the gate electrode;
   forming a recess by etching the semiconductor substrate using the gate electrode and the first sidewall as a mask;
   forming a semiconductor layer in the recess;

removing the first sidewall;

forming a second sidewall including stress film over the side faces of the gate electrode; and forming a third sidewall on the second sidewall, wherein the semiconductor layer is positioned apart from the the second sidewall while placing the third sidewall in between.

7. The method of manufacturing a semiconductor device according to claim 6, wherein the third sidewall includes a film having stress smaller than that of the second sidewall.

* * * * *